United States Patent
Chen et al.

(10) Patent No.: US 12,304,807 B2
(45) Date of Patent: May 20, 2025

(54) SEMICONDUCTOR DEVICE COMPRISING DIFFERENT TYPES OF MICROELECTROMECHANICAL SYSTEMS DEVICES

(71) Applicant: Taiwan Semiconductor Manufacturing Company, Ltd., Hsin-Chu (TW)

(72) Inventors: Hsiang-Fu Chen, Zhubei (TW); Chia-Ming Hung, Taipei (TW); I-Hsuan Chiu, Hsin-Chu (TW)

(73) Assignee: Taiwan Semiconductor Manufacturing Company, Ltd., Hsinchu (JP)

( * ) Notice: Subject to any disclaimer, the term of this patent is extended or adjusted under 35 U.S.C. 154(b) by 0 days.

(21) Appl. No.: 18/365,449

(22) Filed: Aug. 4, 2023

(65) Prior Publication Data
US 2023/0406695 A1    Dec. 21, 2023

Related U.S. Application Data

(62) Division of application No. 16/907,607, filed on Jun. 22, 2020, now Pat. No. 11,851,323.
(Continued)

(51) Int. Cl.
*B81B 7/02* (2006.01)
*B81C 1/00* (2006.01)

(52) U.S. Cl.
CPC ............ *B81B 7/02* (2013.01); *B81C 1/00341* (2013.01); *B81B 2201/0271* (2013.01);
(Continued)

(58) Field of Classification Search
CPC .............. B81B 7/02; B81B 2201/0271; B81B 2203/0127; B81B 2203/0315;
(Continued)

(56) References Cited

U.S. PATENT DOCUMENTS 8,716,852 B2    5/2014    Shu et al.
9,365,416 B2    6/2016    Shu et al.
(Continued)

FOREIGN PATENT DOCUMENTS

CN    102169249 A    8/2011

OTHER PUBLICATIONS

U.S. Appl. No. 15/930,570, filed May 13, 2020.
(Continued)

*Primary Examiner* — Moazzam Hossain
(74) *Attorney, Agent, or Firm* — Eschweiler & Potashnik, LLC

(57) ABSTRACT

Various embodiments of the present disclosure are directed towards a semiconductor device. The semiconductor device includes an interconnect structure disposed over a semiconductor substrate. A dielectric structure is disposed over the interconnect structure. A first cavity and a second cavity are disposed in the dielectric structure. A microelectromechanical system (MEMS) substrate is disposed over the dielectric structure, where the MEMS substrate comprises a first movable membrane overlying the first cavity and a second movable membrane overlying the second cavity. A first functional structure overlies the first movable membrane, where the first functional structure comprises a first material having a first chemical composition. A second functional structure overlies the second movable membrane, where the second functional structure is laterally spaced from the first functional structure, and where the second functional structure comprises a second material having a second chemical composition different than the first chemical composition.

20 Claims, 13 Drawing Sheets

Related U.S. Application Data

(60) Provisional application No. 62/891,489, filed on Aug. 26, 2019.

(52) U.S. Cl.
CPC ............. *B81B 2203/0127* (2013.01); *B81B 2203/0315* (2013.01); *B81B 2207/07* (2013.01); *B81C 2203/036* (2013.01)

(58) Field of Classification Search
CPC .......... B81B 2207/07; B81B 2207/015; B81B 7/0032; B81B 2201/02; B81C 2203/0735; B81C 2203/0771; B81C 2203/01
See application file for complete search history.

(56) References Cited

U.S. PATENT DOCUMENTS

| | | | |
|---|---|---|---|
| 9,567,204 B2 | 2/2017 | Hung et al. | |
| 9,845,236 B2 | 12/2017 | Yu et al. | |
| 10,441,975 B2 | 10/2019 | Apte et al. | |
| 2004/0086427 A1 | 5/2004 | Childers et al. | |
| 2006/0044298 A1 | 3/2006 | Mignard et al. | |
| 2009/0007679 A1* | 1/2009 | Nunez | G01L 19/086 73/715 |
| 2011/0198970 A1 | 8/2011 | Martin et al. | |
| 2013/0113810 A1 | 5/2013 | Ho et al. | |
| 2014/0162393 A1* | 6/2014 | Yang | B81B 7/02 438/51 |
| 2014/0227816 A1* | 8/2014 | Zhang | H01L 21/56 438/48 |
| 2015/0211949 A1 | 7/2015 | Fujita et al. | |
| 2015/0375991 A1 | 12/2015 | Schelling et al. | |
| 2016/0009549 A1 | 1/2016 | Rothberg et al. | |
| 2016/0341616 A1* | 11/2016 | Classen | G01L 9/0042 |
| 2017/0284951 A1 | 10/2017 | Pindl et al. | |
| 2017/0313579 A1 | 11/2017 | Ghidoni et al. | |
| 2017/0325081 A1 | 11/2017 | Chrisikos et al. | |
| 2018/0299622 A1 | 10/2018 | Menard et al. | |
| 2019/0043920 A1 | 2/2019 | Berger et al. | |
| 2019/0382263 A1* | 12/2019 | Classen | B81B 7/02 |

OTHER PUBLICATIONS

Xu et al. "Designing a Practical Access Point Association Protocol." IEEE 2010 Proceedings Infocom, published on May 6, 2010.
Non-Final Office Action dated Dec. 9, 2022 for U.S. Appl. No. 16/907,607.
Final Office Action dated May 4, 2023 for U.S. Appl. No. 16/907,607.
Notice of Allowance dated Sep. 20, 2023 for U.S. Appl. No. 16/907,607.

* cited by examiner

SEMICONDUCTOR DEVICE COMPRISING DIFFERENT TYPES OF MICROELECTROMECHANICAL SYSTEMS DEVICES

REFERENCE TO RELATED APPLICATIONS

This application is a Divisional of U.S. application Ser. No. 16/907,607, filed on Jun. 22, 2020, which claims the benefit of U.S. Provisional Application No. 62/891,489, filed on Aug. 26, 2019. The contents of the above-referenced patent applications are hereby incorporated by reference in their entirety.

BACKGROUND

Microelectromechanical systems (MEMS) is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses), pressure sensors, micro-fluidic elements (e.g., valves, pumps), optical switches (e.g., mirrors), imaging devices (e.g., micromachined ultrasonic transducers (MUTs)), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
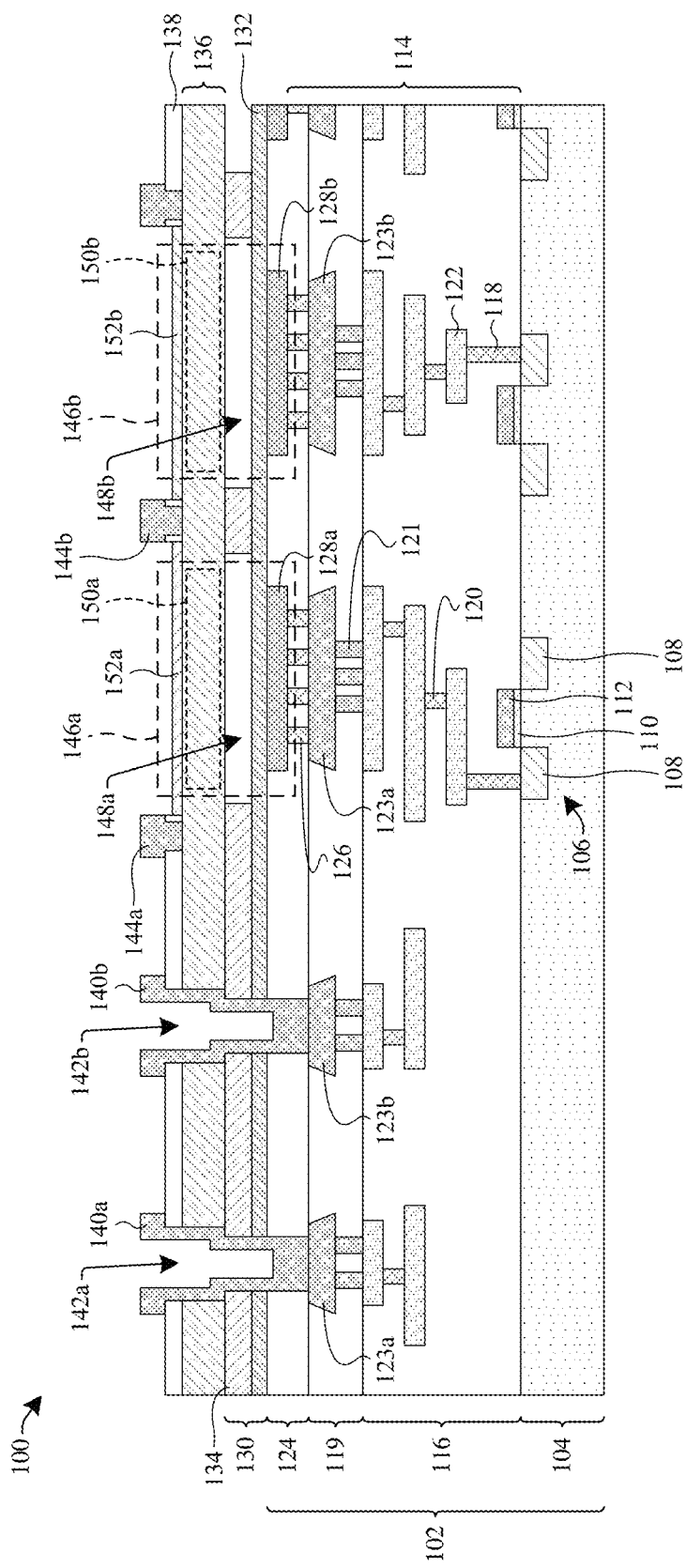
FIG. 1 illustrates a cross-sectional view of some embodiments of a semiconductor device comprising different types of microelectromechanical system (MEMS) devices.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device (e.g., integrated chip) comprises a microelectromechanical systems (MEMS) device. The MEMS device comprises a cavity and a movable membrane. The configuration (e.g., structural configuration) of the MEMS device is dependent on the type of MEMS device. For example, if the MEMS device is a capacitive micromachined ultrasonic transducer (CMUT), the MEMS device has a first configuration that corresponds to the CMUT, while on the other hand if the MEMS device is a piezoelectric micromachined ultrasonic transducer (PMUT), the MEMS device has a second configuration different than the first configuration that corresponds to the PMUT. It will be appreciated that a CMUT and a PMUT are not the only type of MEMS devices with different configurations, rather differences may exist between many other types of MEMS devices, such as a CMUT, PMUT, contact-type ultrasonic MEMS sensor (e.g., fingerprint sensor), non-contact-type ultrasonic MEMS sensor (e.g., gesture sensor), a resonant-type mechanical MEMS device (e.g., radio frequency (RF) switch, RF filter, etc.), pressure sensor, moisture sensor, fluid sensor (e.g., gas composition sensor), biosensor (e.g., MEMS-based glucose sensor), IR sensor (e.g., IR detection sensor, IR image sensor, etc.), etc.

One difference in the configurations of different types of MEMS devices is a difference in the chemical composition of a functional structure that overlies the movable membrane. For example, if the MEMS device is an IR sensor, the MEMS device may have a first functional structure having a first chemical composition overlying the movable membrane of the MEMS device. On the other hand, if the MEMS device is a PMUT, the MEMS device may have a second functional structure having a second chemical composition different than the first chemical composition overlying the movable membrane of the MEMS device. It will be appreciated that differences in configurations between different types of MEMS devices is not limited to a difference in the chemical compositions of the functional structure, rather other types of differences may exist between the different types of MEMS devices, such as differences in doping concentrations of the movable membrane, the presence versus absence of the functional structure, etc.

Typically, the semiconductor device only comprises MEMS devices of the same type. For example, if the semiconductor device comprises the CMUT, the semiconductor device will only comprise CMUTs. On the other hand, if the semiconductor device comprises the PMUT, the semiconductor device will only comprise PMUTs. Thus, a single semiconductor device comprising different types of MEMS devices is desirable to reduce manufacturing costs, reduce packaging sizes, reduce power consumption, etc.

Various embodiments of the present application are directed toward a semiconductor device comprising different types of MEMS devices. The semiconductor device comprises an interconnect structure disposed over a semiconductor substrate. A dielectric structure is disposed over the interconnect structure. A microelectromechanical system (MEMS) substrate is disposed over the dielectric structure. A first MEMS device is disposed over the semiconductor substrate. The first MEMS device comprises a first cavity disposed in the dielectric structure, and a first movable membrane of the MEMS substrate that overlies the first cavity. Further, the first MEMS device comprises a first functional structure overlying the first movable membrane and the first cavity. The first functional structure comprises a first material having a first chemical composition. A second MEMS device is disposed over the semiconductor substrate and laterally spaced from the first MEMS device. The second MEMS device comprises a second cavity disposed in the dielectric structure, and a second movable membrane of the MEMS substrate that overlies the second cavity. Further, the second MEMS device comprises a second functional structure overlying the second movable membrane and the second cavity. The second functional structure comprises a second material having a second chemical composition that is different than the first chemical composition.

Because the second material has a different chemical composition than the first material, a physical property of the first functional structure may change in response to a first external stimulus while a physical property of the second functional structure may change in response to a second stimulus that is different than the first stimulus. Thus, the MEMS device is a first type of MEMS device and the second MEMS device is a second type of MEMS device different than the first type. Accordingly, the semiconductor device comprises different types of MEMS devices, which may reduce manufacturing costs, reduce packaging sizes, reduce power consumption, etc.

FIG. 1 illustrates a cross-sectional view of some embodiments of a semiconductor device 100 comprising different types of microelectromechanical system (MEMS) devices.

As shown in FIG. 1, the semiconductor device 100 comprises an integrated circuit (IC) structure 102. The IC structure 102 comprises a semiconductor substrate 104. The semiconductor substrate 104 may comprise any type of semiconductor body (e.g., monocrystalline silicon/CMOS bulk, silicon-germanium (SiGe), silicon on insulator (SOI), etc.).

In some embodiments, one or more IC devices 106 are disposed on/over the semiconductor substrate 104. The IC devices 106 may be or comprise, for example, active electronic devices (e.g., transistors), passive electronic devices (e.g., resistors, capacitors, inductors, fuses, etc.), some other electronic devices, or a combination of the foregoing. For example, one of the IC devices 106 may be a metal-oxide-semiconductor field-effect transistor (MOSFET) comprising a pair of source/drain regions 108 disposed in the semiconductor substrate 104, a gate dielectric 110 disposed over the semiconductor substrate 104 and between the source/drain regions 108, and a gate electrode 112 disposed over the semiconductor substrate 104 and overlying the gate dielectric 110. For readability, only some of the IC devices 106 are specifically labeled. In further embodiments, the IC structure 102 is a complementary metal-oxide-semiconductor (CMOS) structure and the IC devices 106 are part of a CMOS circuit.

The IC structure 102 comprises an interconnect structure 114, a first dielectric structure 116, a second dielectric structure 119, a third dielectric structure 124, and a plurality of electrodes 128 disposed over the semiconductor substrate 104 and the IC devices 106. The interconnect structure 114 comprises one or more first conductive contacts 118, one or more first conductive vias 120, one or more first conductive lines 122, a plurality of second conductive vias 121, a plurality of second conductive lines 123, and a plurality of third conductive vias 126. The first conductive contacts 118, the first conductive vias 120, and the first conductive lines 122 are embedded in the first dielectric structure 116. In some embodiments, the first conductive contacts 118, the first conductive vias 120, and the first conductive lines 122 are referred to as a CMOS interconnect structure. The CMOS interconnect structure interconnects the IC devices 106 together in a predefined pattern.

The second dielectric structure 119 is disposed over the first dielectric structure 116, the first conductive contacts 118, the first conductive vias 120, and the first conductive lines 122. The second conductive vias 121 and the second conductive lines 123 are embedded in the second dielectric structure 119. The third dielectric structure 124 is disposed over the second dielectric structure 119, the second conductive vias 121, and the second conductive lines 123. The third conductive vias 126 and the electrodes 128 are embedded in the third dielectric structure 124.

The interconnect structure 114 electrically couples the IC devices 106 to the electrodes 128. For example, the interconnect structure 114 electrically couples one or more of the IC devices 106 to a first electrode 128a of the electrodes 128 and/or one or more of the IC devices 106 to a second electrode 128b of the electrodes 128. For readability, only some of the first conductive contacts 118, only some of the first conductive vias 120, only some of the first conductive lines 122, only some of the second conductive vias 121, only some of the second conductive lines 123, only some of the third conductive vias 126, and only some of the electrodes 128 are specifically labeled.

The first conductive contacts 118, the first conductive vias 120, the first conductive lines 122, and/or the third conductive vias 126 may be or comprise, for example, a metal (e.g., copper (Cu), aluminum (Al), tungsten (W), or the like), a metal nitride (e.g., titanium nitride (TiN)), polysilicon (e.g., doped polysilicon), some other conductive material, or a combination of the foregoing. The second conductive vias 121 and the second conductive lines 123 may comprise, for example, a metal (e.g., Al, Cu, aluminum-copper (AlCu), titanium (Ti), silver (Ag), gold (Au), or the like), a metal nitride (e.g., TiN), some other conductive material, or a combination of the foregoing. The electrodes 128 may be or comprise, for example, a metal (e.g., Al, Cu, AlCu, Ti, or the like), a metal nitride (e.g., TiN), some other conductive material, or a combination of the foregoing. The first dielectric structure 116, the second dielectric structure 119, and the third dielectric structure 124 comprise one or more stacked dielectric layers, which may respectively comprise a low-k dielectric (e.g., a dielectric material with a dielectric constant less than about 3.9), an oxide (e.g., silicon dioxide ($SiO_2$)), or the like.

A fourth dielectric structure 130 is disposed over the interconnect structure 114 and the third dielectric structure 124. The fourth dielectric structure 130 comprises a first dielectric layer 132 and a second dielectric layer 134. The second dielectric layer 134 is disposed over the first dielectric layer 132. In some embodiments, the first dielectric layer 132 covers the electrodes 128.

The first dielectric layer 132 may be or comprise, for example, a nitride (e.g., silicon nitride (SiN)), an oxide (e.g., $SiO_2$), an oxy-nitride (e.g., silicon oxy-nitride ($SiO_XN_Y$)), some other dielectric material, or a combination of the foregoing. The second dielectric layer 134 may be or comprise, for example, an oxide (e.g., $SiO_2$), a nitride (e.g., SiN), an oxy-nitride (e.g., $SiO_XN_Y$), some other dielectric material, or a combination of the foregoing. In some embodiments, the first dielectric layer 132 may be a different dielectric material than the second dielectric layer 134. For example, the first dielectric layer 132 may be SiN and the second dielectric layer 134 may be $SiO_2$. While the fourth dielectric structure 130 is illustrated comprising the first dielectric layer 132 and the second dielectric layer 134, it will be appreciated that the fourth dielectric structure 130 may comprise any number of dielectric layers.

A microelectromechanical system (MEMS) substrate 136 is disposed over the fourth dielectric structure 130 and the IC structure 102. In some embodiments, the MEMS substrate 136 is disposed on the fourth dielectric structure 130. In further embodiments, a bond interface exists at an interface of the MEMS substrate 136 and the fourth dielectric structure 130. For example, in some embodiments, the MEMS substrate 136 is bonded to the fourth dielectric structure 130 via a bonding process (e.g., fusion bonding), thereby forming the bond interface at the interface of the MEMS substrate 136 and the fourth dielectric structure 130. The MEMS substrate 136 may be or comprise, for example, a semiconductor material (e.g., polysilicon, amorphous silicon, monocrystalline silicon, SiGe, Ge, or the like), a metal (e.g., Al, Cu, AlCu), an oxide (e.g., $SiO_2$), a nitride (e.g., SiN), some other suitable MEMS substrate, or a combination of the foregoing. In some embodiments in which the MEMS substrate 136 is or comprises a semiconductor material, the semiconductor material may be doped or undoped. In yet further embodiments, the MEMS substrate 136 is a single semiconductor structure comprising the semiconductor material.

A third dielectric layer 138 is disposed over the MEMS substrate 136 and the fourth dielectric structure 130. A plurality of fourth conductive vias 140 extend vertically through the third dielectric layer 138, the MEMS substrate 136, the fourth dielectric structure 130, and the third dielectric structure 124 to contact at least one of the second conductive lines 123, such that the fourth conductive vias 140 are electrically coupled to the interconnect structure 114. For example, a fifth conductive via 140a, which is one of the fourth conductive vias 140, extends vertically through the third dielectric layer 138, the MEMS substrate 136, the fourth dielectric structure 130, and the third dielectric structure 124 to contact a third conductive line 123a, which is one of the second conductive lines 123, so that the fifth conductive via 140a is electrically coupled to the interconnect structure 114. Further, a sixth conductive via 140b, which is another one of the fourth conductive vias 140, extends vertically through the third dielectric layer 138, the MEMS substrate 136, the fourth dielectric structure 130, and the third dielectric structure 124 to contact a fourth conductive line 123b, which is another one of the second conductive lines 123, so that the sixth conductive via 140b is electrically coupled to the interconnect structure 114. The fourth conductive vias 140 are laterally spaced from one another. In some embodiments, the fourth conductive vias 140 are electrically isolated from one another. In further embodiments, the fourth conductive vias 140 extend laterally over an upper surface of the third dielectric layer 138.

The fourth conductive vias 140 line a plurality of via openings 142, respectively. For example, the fifth conductive via 140a lines a first via opening 142a, which is one of the via openings 142, and the sixth conductive via 140b lines a second via opening 142b, which is another one of the via openings 142. The via openings 142 are disposed in the third dielectric layer 138, the MEMS substrate 136, the fourth dielectric structure 130, and the third dielectric structure 124. The via openings 142 extend vertically through the third dielectric layer 138, the MEMS substrate 136, the fourth dielectric structure 130, and the third dielectric structure 124 to expose one or more of the second conductive lines 123. For example, the first via opening 142a extends vertically through the third dielectric layer 138, the MEMS substrate 136, the fourth dielectric structure 130, and the third dielectric structure 124 to expose the third conductive line 123a. The via openings 142 are at least partially defined by the third dielectric layer 138, the MEMS substrate 136, the fourth dielectric structure 130, and the second conductive lines 123. For example, sidewalls of the first via opening 142a are defined by sidewalls of the third dielectric layer 138, sidewalls of the MEMS substrate 136, sidewalls of the fourth dielectric structure 130, and sidewalls of the third dielectric structure 124, and a bottom surface of the first via opening 142a is at least partially defined by an upper surface of the third conductive line 123a.

A plurality of second conductive contacts 144 are disposed over the MEMS substrate 136 and the third dielectric layer 138. For example, a third conductive contact 144a, which is one of the second conductive contacts 144, and a fourth conductive contact 144b, which is another one of the second conductive contacts 144, are disposed over the MEMS substrate 136 and the third dielectric layer 138. In some embodiments, the second conductive contacts 144 extend through the third dielectric layer 138 and contact the MEMS substrate 136. In further embodiments, the second conductive contacts 144 are electrically coupled to the MEMS substrate 136. For readability, only some of the second conductive contacts 144 are specifically labeled. The second conductive contacts 144 may be electrically coupled to the interconnect structure 114 via the fourth conductive vias 140. For example, the third conductive contact 144a is electrically coupled to the fifth conductive via 140a, and the fourth conductive contact 144b is electrically coupled to the sixth conductive via 140b.

The third dielectric layer 138 may be or comprise, for example, an oxide (e.g., $SiO_2$), a nitride (e.g., SiN), an oxy-nitride (e.g., SiO$_X$N$_Y$), some other dielectric material, or a combination of the foregoing. The fourth conductive vias 140 may be or comprise, for example, a metal (e.g., Al, Cu, AlCu, Ti, Ag, Au, or the like), a metal nitride (e.g., TiN), some other conductive material, or a combination of the foregoing. The second conductive contacts 144 may be or comprise, for example, a metal (e.g., Al, Cu, AlCu, Ti, Ag, Au, or the like), a metal nitride (e.g., TiN), some other conductive material, or a combination of the foregoing. In some embodiments, the fourth conductive vias 140 and the second conductive contacts 144 are a same material. In further embodiments, the fourth conductive vias 140 may have a thickness between about 0.05 micrometers (um) and about 1 um. In yet further embodiments, the second conductive contacts 144 may have a thickness between about 0.05 um and about 1 um.

The semiconductor device 100 comprises a plurality of MEMS devices 146 that are disposed over the semiconductor substrate 104 and the second dielectric structure 119. The MEMS devices 146 are laterally spaced from one another. The MEMS devices 146 comprise a first plurality of cavities 148, respectively, a first plurality of movable membranes 150, respectively, and the electrodes 128, respectively. The cavities 148 are laterally spaced from one another. The movable membranes 150 are laterally spaced from one another. The movable membranes 150 are portions of the MEMS substrate 136 that are configured to move (e.g., flex) in response to one or more stimuli (e.g., pressure, voltage, etc.). In some embodiments, the electrodes 128 are laterally spaced from one another. For readability, only some of the MEMS devices 146, some of the cavities 148, and some of the movable membranes 150 are specifically labeled.

For example, the MEMS devices 146 comprise a first MEMS device 146a and a second MEMS device 146b. The first MEMS device 146a is laterally spaced from the second MEMS device 146b. The first MEMS device 146a comprises a first cavity 148a of the cavities 148, a first movable membrane 150a of the movable membranes 150, and the first electrode 128a. The second MEMS device 146b comprises a second cavity 148b of the cavities 148, a second movable membrane 150b of the movable membranes 150, and the second electrode 128b. The first cavity 148a is laterally spaced from the second cavity 148b. The first movable membrane 150a is laterally spaced from the second movable membrane 150b.

Each of the MEMS devices 146 are a different type of MEMS device. For example, the first MEMS device 146a is a first type of MEMS device, and the second MEMS device 146b is a second type of MEMS device that is different than the first type of MEMS device. The MEMS devices 146 may be, for example, a capacitive micromachined ultrasonic transducer (CMUT), a piezoelectric micromachined ultrasonic transducer (PMUT), a contact-type ultrasonic MEMS sensor (e.g., fingerprint sensor), a non-contact-type ultrasonic MEMS sensor (e.g., gesture sensor), a resonant-type mechanical MEMS device (e.g., radio frequency (RF) switch, RF filter, etc.), a pressure sensor, a moisture sensor, a fluid sensor (e.g., gas composition sensor), a biosensor (e.g., MEMS-based glucose sensor), an IR sensor (e.g., IR detection sensor, IR image sensor, etc.), or some other type of MEMS device. For example, the first MEMS device 146a may be an IR detection sensor, and the second MEMS device may be any other type of MEMS device besides the IR detection sensor (e.g., a CMUT, a different type of IR sensor, etc.). Because the semiconductor device 100 comprises different types of MEMS devices, the semiconductor device 100 may reduce manufacturing costs, reduce packaging sizes, reduce power consumption, etc.

The MEMS devices 146 have different configurations (e.g., structural configurations) that are dependent on the MEMS devices 146 respective type of MEMS device. For example, the first MEMS device 146a has a first configuration that is dependent on the type of the first MEMS device 146a (e.g., IR detection sensor), and the second MEMS device 146b has a second configuration different than the first configuration that is dependent on the type of the second MEMS device 146b (e.g., CMUT). Some embodiments of different types of MEMS devices with different configurations are described in more detail herein.

In some embodiments, the MEMS devices 146 comprise functional structures 152, respectively. The functional structures 152 overlie the movable membranes 150 of the MEMS devices 146, respectively. In further embodiments, the functional structures 152 may be laterally spaced. For example, the first MEMS device 146a comprises a first functional structure 152a that overlies the first movable membrane 150a, and the second MEMS device 146b comprises a second functional structure 152b that overlies the second movable membrane 150b. The first functional structure 152a is laterally spaced from the second functional structure 152b. In some embodiments, bottommost surfaces of the functional structures 152 are substantially co-planar. For example, a bottommost surface of the first functional structure 152a is substantially co-planar with a bottommost surface of the second functional structure 152b.

Physical properties of the functional structures 152 change in response to being exposed to stimuli, respectively. For example, a physical property of the first functional structure 152a changes in response to being exposed to a first stimulus, and a physical property of the second functional structure 152b changes in response to being exposed to a second stimulus. In some embodiments, the type of MEMS device is at least partially dependent on the physical properties of the functional structures 152 that change in response to the stimuli and/or the stimuli that cause the physical properties of the functional structures 152 to change. For example, if a physical property of the first functional structure 152a changes in response to being exposed to IR, the first MEMS device 146a is an IR sensor. Further, if the first MEMS device 146a is configured to detect IR, the IR sensor is an IR detection sensor. On the other hand, if the first MEMS device 146a is configured to generate an image based on IR, the first MEMS device 146a is an IR image sensor. It will be appreciated that the type of MEMS devices may be dependent on other characteristics of the MEMS devices 146 (e.g., working principle, such as a thermoelectric IR sensor, pyroelectric IR sensor, bolometer IR sensor, etc.).

In some embodiments, the physical properties of the functional structures 152 that change in response to the stimuli and/or the stimuli that cause the physical properties of the functional structures 152 to change are at least partially dependent on the chemical composition of the functional structures. For example, if the first MEMS device 146a is an IR sensor, the first functional structure 152a may be or comprise an infrared sensitive material, and if the second MEMS device 146b is a PMUT, the second functional structure 152b may be or comprise a piezoelectric material. Accordingly, the configurations of different types of MEMS devices may be different in respect to the chemical composition of their respective functional structures.

The MEMS devices 146 may be MEMS sensors, MEMS actuators, MEMS transceivers, or a combination of the foregoing. For example, if the first MEMS device 146a is a MEMS sensor, the first MEMS device 146a is configured to sense the change in the physical property of the first functional structure 152a. In some embodiments, a shape of the first functional structure 152a may change in response to being exposed to the first stimulus (e.g., an electrical signal (e.g., voltage), a fluid (e.g., a gas), a biological element (e.g., blood), radiation (e.g., IR), etc.). The change in shape of the first functional structure 152a may deflect the first movable membrane 150a causing the first MEMS device 146a to output an electrical signal that corresponds to a distance in which the first movable membrane 150a is spaced from the first electrode 128a (e.g., due to a change in capacitance between the first movable membrane 150a and the first electrode 128a). The electrical signal may be output via the first electrode 128a and analyzed by one or more of the IC devices 106. In other embodiments, the change in physical property may change a capacitance between the first functional structure 152a and the first electrode 128a (e.g., due to the physical property changing a voltage of the first functional structure 152a).

In some embodiments, a shape of the second functional structure 152b may change in response to being exposed to the second stimulus (e.g., an electrical signal (e.g., voltage), a fluid (e.g., a gas), a biological element (e.g., blood), radiation (e.g., IR), etc.). The change in shape of the second functional structure 152b may deflect the second movable membrane 150b causing the second MEMS device 146b to output an electrical signal that corresponds to a distance in which the second movable membrane 150b is spaced from the second electrode 128b (e.g., due to a change in capacitance between the second movable membrane 150b and the second electrode 128b). The electrical signal may be output via the second electrode 128b and analyzed by one or more of the IC devices 106. In other embodiments, the change in physical property may change a capacitance between the second functional structure 152b and the second electrode 128b (e.g., due to the physical property changing a voltage of the second functional structure 152b). In yet further embodiments, if the MEMS devices 146 are MEMS sensors, the functional structures 152 may be referred to as sensing structures.

If the first MEMS device 146a is a MEMS actuator, the change in the physical property of the first functional structure 152a causes the first MEMS device to output an action (e.g., mechanical movement, magnetic field, heat, etc.). If the first MEMS device 146a is a MEMS transducer (e.g., CMUT), the first MEMS device 146a may operate as both a receiver (e.g., MEMS sensor) and a transmitter (e.g., MEMS actuator) to both output an action and sense a response to the action. It will be appreciated that a MEMS sensor, a MEMS actuator, and a MEMS transceiver may be different types of MEMS devices.

The functional structures 152 may be or comprise, for example, a piezoelectric material (e.g., molybdenum (Mo), lead zirconate titanate (PZT), aluminum nitride (AlN), zinc oxide (ZnO), etc), a biosensitive material (e.g., a bio-recognition component disposed on (or part of) a metal (e.g., Au, Ag, platinum (Pt), etc.)), an IR sensitive material (e.g., vanadium oxide (VOx), mercury cadmium telluride (HgCdTe), silicon (Si), cadmium zinc telluride (CdZnTe), etc.), a polymer (e.g., polyimide, SU-8, negative/positive photoresist, etc.), or the like. In some embodiments, if the first functional structure 152a is a piezoelectric material, the first MEMS device 146a may be a PMUT; if the first functional structure 152a is a biosensitive material, the first MEMS device 146a may be a biosensor; if the first functional structure 152a is an IR sensitive material, the first MEMS device 146a may be an IR sensor; and if the first functional structure 152a is a polymer, the first MEMS device 146a may some other type of MEMS sensor (e.g., pressure sensor, gas sensor, moisture sensor, etc.).

Accordingly, it will be appreciated that, in some embodiments, the first functional structure 152a is or comprises a first type of material while the second functional structure 152b is not (or does not comprise) the first type of material. For example, the first functional structure 152a is (or comprises) an IR sensitive material and the second functional structure 152b is not (or does not comprise) the IR sensitive material, the first functional structure 152a is (or comprises) a piezoelectric material and the second functional structure 152b is not (or does not comprise) the piezoelectric material, the first functional structure 152a is (or comprises) a biosensitive material and the second functional structure 152b is not (or does not comprise) the biosensitive material, the first functional structure 152a is (or comprises) a polymer and the second functional structure 152b is not (or does not comprise) the polymer, etc.

In some embodiments, the functional structures 152 may each have a thickness between about 0.0005 um and about 50 um. If the functional structures 152 have a thickness that is less than about 0.0005 um, the MEMS devices 146 may not be able to sense a change in the physical properties of the functional structures 152 (and/or cause a change in the physical properties of the functional structures 152). If the functional structures 152 have a thickness that is greater than about 50 um, a cost to manufacture the semiconductor device 100 may be increased without an appreciable benefit. More specifically, if the functional structures 152 comprise a polymer, the functional structures 152 may have a thickness between about 0.0005 um and about 10 um; if the functional structures 152 comprise an IR sensitive material, the functional structures 152 may have a thickness between about 0.1 um and about 0.2 um; and if the functional structures 152 comprise a piezoelectric material, the functional structures 152 may have a thickness between about 0.05 um and about 50 um.

If the functional structures 152 comprise a polymer and have a thickness less than about 0.0005 um, the MEMS devices 146 may not be able to sense a change in the physical properties of the functional structures 152 (and/or cause a change in the physical properties of the functional structures 152). If the functional structures 152 comprise a polymer and have a thickness greater than about 10 um, a cost to manufacture the semiconductor device 100 may be increased without an appreciable benefit. If the functional structures 152 comprise an IR sensitive material and have a thickness less than about 0.1 um, the MEMS devices 146 may not be able to sense a change in the physical properties of the functional structures 152 (and/or cause a change in the physical properties of the functional structures 152). If the functional structures 152 comprise an IR sensitive material and have a thickness greater than about 0.2 um, a cost to manufacture the semiconductor device 100 may be increased without an appreciable benefit. If the functional structures 152 comprise a piezoelectric material and have a thickness less than about 0.05 um, the MEMS devices 146 may not be able to sense a change in the physical properties of the functional structures 152 (and/or cause a change in the physical properties of the functional structures 152). If the functional structures 152 comprise a piezoelectric material and have a thickness greater than about 50 um, a cost to manufacture the semiconductor device 100 may be increased without an appreciable benefit.

In some embodiments, the thicknesses of the functional structures 152 may be substantially the same. For example, a thickness of the first functional structure 152a may be substantially the same as the second functional structure 152b. In other embodiments, the thicknesses of the functional structures 152 may be different. For example, a thickness of the first functional structure 152a may be different than the thickness of the second functional structure 152b.

In some embodiments, the third conductive contact 144a, the fifth conductive via 140a, and the third conductive line 123a are part of a first MEMS routing structure that is electrically coupled to one or more of the IC devices 106. The fourth conductive contact 144b, the sixth conductive via 140b, and the fourth conductive line 123b may be part of a second MEMS routing structure that is electrically coupled to one or more of the IC devices 106. The first MEMS routing structure electrically couples the first MEMS device 146a to the one or more of the IC devices 106, and the second MEMS routing structure electrically couples the second MEMS device 146b to the one or more IC devices 106. In some embodiments, the first MEMS routing structure may be electrically coupled to one or more of the IC devices 106 and the first functional structure 152a. In further embodiments, the second MEMS routing structure may be electrically coupled to one or more of the IC devices 106 and the second functional structure 152b.

In some embodiments, the first MEMS routing structure and the second MEMS routing structure may be electrically isolated from one another. In further embodiments, the first MEMS routing structure and the second MEMS routing structure may be electrically coupled to different (or a different set) of IC devices 106. In other embodiments, the first MEMS routing structure and the second MEMS routing structure may be electrically coupled to one or more of the same IC devices 106. It will be appreciated that, in some embodiments, the semiconductor device 100 comprises a MEMS routing structure for each MEMS devices 146.

Figure 2:
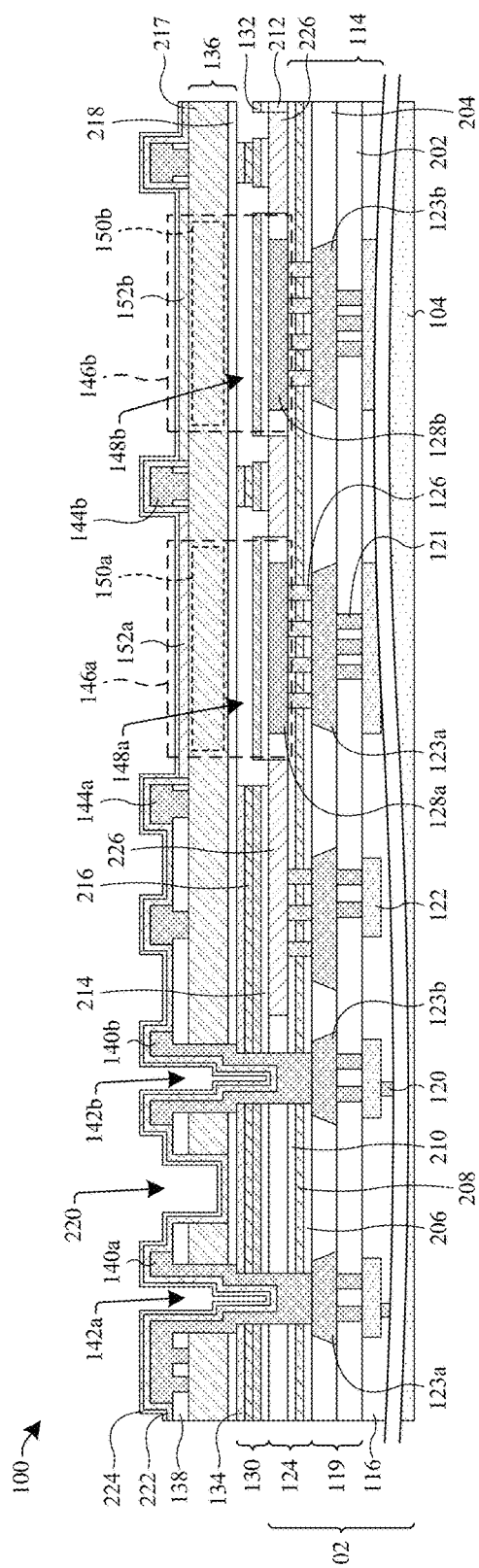
FIG. 2 illustrates a cross-sectional view of some more detailed embodiments of the semiconductor device of FIG. 1.

FIG. 2 illustrates a cross-sectional view of some more detailed embodiments of the semiconductor device 100 of FIG. 1.

As shown in FIG. 2, the second dielectric structure 119 comprises a fourth dielectric layer 202 and a fifth dielectric layer 204. The fourth dielectric layer 202 may be or comprise, for example, a low-k dielectric (e.g., a dielectric material with a dielectric constant less than about 3.9), an oxide (e.g., silicon dioxide ($SiO_2$)), or the like. The fifth dielectric layer 204 is disposed over the fourth dielectric layer 202. The fifth dielectric layer 204 may be or comprise, for example, a low-k dielectric (e.g., a dielectric material with a dielectric constant less than about 3.9), an oxide (e.g., silicon dioxide ($SiO_2$)), or the like. In some embodiments, the second conductive lines 123 are disposed in the fifth dielectric layer 204. The second conductive vias 121 may be disposed in the fourth dielectric layer 202. In further embodiments, the second conductive vias 121 and/or the fourth dielectric layer 202 are disposed vertically between the first dielectric structure 116 and the fifth dielectric layer 204.

The third dielectric structure 124 comprises a sixth dielectric layer 206, a first outgassing prevention layer 208, a seventh dielectric layer 210, and an eighth dielectric layer 212. The first outgassing prevention layer 208 is disposed over the sixth dielectric layer 206, the seventh dielectric layer 210 is disposed over the first outgassing prevention layer 208, and the eighth dielectric layer 212 is disposed over the seventh dielectric layer 210. In some embodiments, the electrodes 128 are disposed in the eighth dielectric layer 212. In further embodiments, the third conductive vias 126 extend vertically through the sixth dielectric layer 206, the first outgassing prevention layer 208, and the seventh dielectric layer 210. In yet further embodiments, the electrodes 128 may have a thickness between about 0.05 um and about 1 um.

The first outgassing prevention layer 208 prevents gases (e.g., oxygen, carbon dioxide, or the like) from outgassing from other features of the semiconductor device 100 into the cavities 148. In some embodiments, the first outgassing prevention layer 208 may be or comprise, for example, a nitride (e.g., SiN), an oxy-nitride (e.g., $SiO_XN_Y$), some other outgassing prevention material, or a combination of the foregoing. In further embodiments, the sixth dielectric layer 206, the seventh dielectric layer 210, and/or the eighth dielectric layer 212 may be, for example, a low-k dielectric (e.g., a dielectric material with a dielectric constant less than about 3.9), an oxide (e.g., silicon dioxide ($SiO_2$)), or the like.

The fourth dielectric structure 130 comprises a ninth dielectric layer 214, the first dielectric layer 132, a second outgassing prevention layer 216, and the second dielectric layer 134. The first dielectric layer 132 is disposed over the ninth dielectric layer 214, the second outgassing prevention layer 216 is disposed over the first dielectric layer 132, and the second dielectric layer 134 is disposed over the second outgassing prevention layer 216. The second outgassing prevention layer 216 prevents gases (e.g., oxygen, carbon dioxide, or the like) from outgassing from other features of the semiconductor device 100 into the cavities 148. In some embodiments, the second outgassing prevention layer 216 may be or comprise, for example, a nitride (e.g., SiN), an oxy-nitride (e.g., $SiO_XN_Y$), some other outgassing prevention material, or a combination of the foregoing. In further embodiments, the ninth dielectric layer 214 may be or comprise, for example, a low-k dielectric (e.g., a dielectric material with a dielectric constant less than about 3.9), an oxide (e.g., silicon dioxide ($SiO_2$)), or the like.

In some embodiments, the MEMS substrate 136 comprises a first MEMS structure 217 and a second MEMS structure 218. The first MEMS structure 217 is disposed over the second MEMS structure 218. In some embodiments, the first MEMS structure 217 is a semiconductor structure comprising the semiconductor material (e.g., polysilicon, amorphous silicon, monocrystalline silicon, SiGe, Ge, or the like). In further embodiments, the second MEMS structure 218 comprises one or more dielectric layers, which respectively comprise an oxide (e.g., $SiO_2$), a nitride (e.g., SiN), or the like. In yet further embodiments, the second MEMS structure 218 may be a single layer of $SiO_2$. The bond interface may exist at an interface of the second MEMS structure 218 and the second dielectric layer 134. For example, in some embodiments, the second MEMS structure 218 is bonded to the second dielectric layer 134 via a bonding process (e.g., fusion bonding), thereby forming the bond interface at the interface of the second MEMS structure 218 and the second dielectric layer 134. In some embodiments, the second dielectric layer 134 may have a thickness between about 0.1 um and about 10 um. In further embodiments, the second MEMS structure 218 may have a thickness between about 0.0005 um and about 1 um.

An isolation trench 220 is disposed laterally between the fifth conductive via 140a and the sixth conductive via 140b. In some embodiments, the isolation trench 220 extends vertically through the third dielectric layer 138 and the first MEMS structure 217. In further embodiments, the isolation trench extends vertically through the MEMS substrate 136.

The isolation trench 220 may extend laterally around the MEMS devices 146 in a closed path. The isolation trench 220 electrically isolates (or increases an electrical resistivity) between the fifth conductive via 140a and the sixth conductive via 140b. It will be appreciated that, in some embodiments, the isolation trench 220 may be one of a plurality of isolation trenches disposed laterally between the fourth conductive vias 140, respectively.

A first passivation layer 222 is disposed over the MEMS substrate 136, the third dielectric layer 138, the fourth conductive vias 140, and the second conductive contacts 144. In some embodiments, the first passivation layer 222 lines the fourth conductive vias 140, an upper surface of the third dielectric layer 138, one or more sidewalls of the third dielectric layer 138, one or more sidewalls of the first MEMS structure 217, an upper surface of the second MEMS structure 218, one or more sidewalls of the second conductive contacts 144, and upper surfaces of the second conductive contacts 144. In further embodiments, the first passivation layer 222 may contact an upper surface of the MEMS substrate 136 between the third dielectric layer 138 and the functional structures 152.

In some embodiments, the first passivation layer 222 may laterally separate the functional structures 152 from the third dielectric layer 138. In such embodiments, portions of the first passivation layer 222 may extend vertically from the MEMS substrate 136 between sidewalls of the functional structures 152 and sidewalls of the third dielectric layer 138. In further such embodiments, the first passivation layer 222 may directly contact the MEMS substrate 136, the sidewalls of the functional structures 152, and/or the sidewalls of the third dielectric layer 138. The first passivation layer 222 may be a conformal layer. In some embodiments, the first passivation layer 222 may be or comprise, for example, an oxide (e.g., $SiO_2$), a nitride (e.g., SiN), an oxy-nitride (e.g., $SiO_xN_y$), some other dielectric material, or a combination of the foregoing. In further embodiments, the first passivation layer 222 has a different chemical composition than the functional structures 152.

A second passivation layer 224 may be disposed over the MEMS substrate 136, the third dielectric layer 138, the fourth conductive vias 140, the second conductive contacts 144, the first passivation layer 222, and the functional structures 152. In some embodiments, the second passivation layer 224 lines the first passivation layer 222 and the functional structures 152. In further embodiments, the second passivation layer 224 may line upper surfaces of the functional structures 152. The second passivation layer 224 may be or comprise, for example, an oxide (e.g., $SiO_2$), a nitride (e.g., SiN), an oxy-nitride (e.g., $SiO_xN_y$), some other dielectric material, or a combination of the foregoing. In some embodiments, the second passivation layer 224 may have a thickness between about 0.05 um and about 2 um. In further embodiments, the second passivation layer 224 has a different chemical composition than the functional structures 152.

One or more gas getter structures 226 may be disposed in the third dielectric structure 124. In some embodiments, the gas getter structures 226 are disposed over the first outgassing prevention layer 208. In further embodiments, the gas getter structures 226 are disposed in the eighth dielectric layer 212. The gas getter structures 226 are configured to absorb and/or consume gases within the cavities 148. The gas getter structures 226 may be or comprise, for example, Al, Cu, W, Ti, Au, some other suitable gas getter material, or a combination of the foregoing. In yet further embodiments, the gas getter structures 226 and the electrodes 128 comprise a same material. For readability, only some of the gas getter structures 226 are specifically labeled.

The cavities 148 are at least partially defined by the MEMS substrate 136 and the fourth dielectric structure 130. In some embodiments, a bottom surface of the first MEMS structure 217 defines upper surfaces of the cavities 148. In other embodiments, a bottom surface of the second MEMS structure 218 defines upper surfaces of the cavities 148. In some embodiments, sidewalls of the cavities 148 are defined by sidewalls of the second dielectric layer 134, the second outgassing prevention layer 216, the first dielectric layer 132, and the ninth dielectric layer 214. In further embodiments, first lower surfaces of the cavities 148 are defined by upper surfaces of the first dielectric layer 132. In yet further embodiments, second lower surfaces of the cavities 148 are defined by upper surfaces of the gas getter structures 226. The second lower surfaces of the cavities 148 may be disposed between the first upper surfaces of the cavities 148 and the semiconductor substrate 104.

Figure 3:
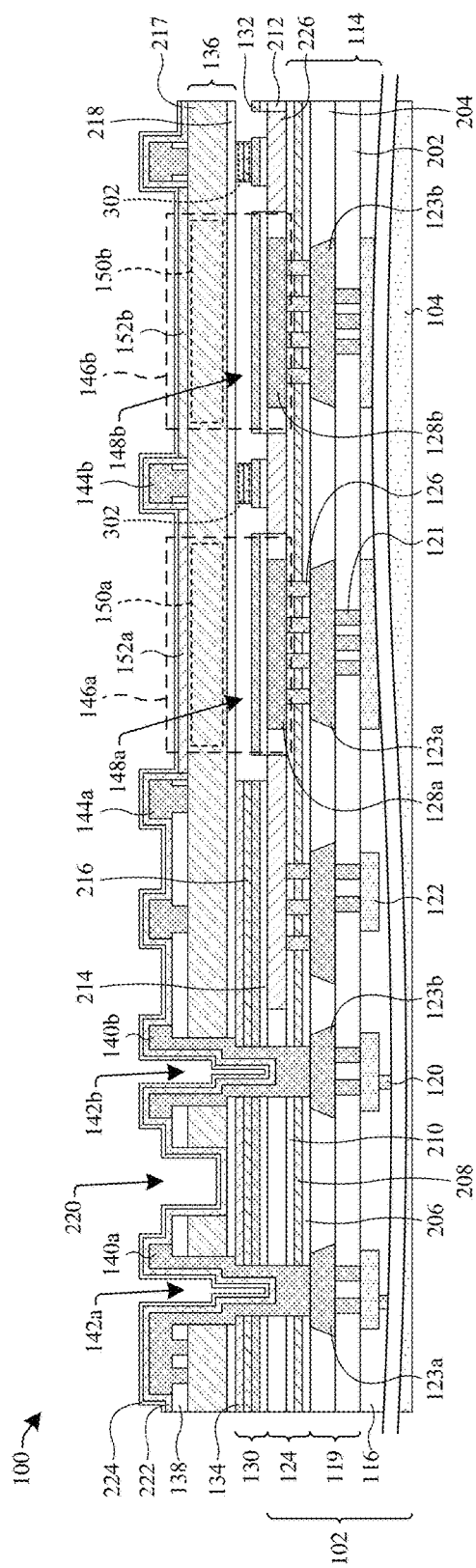
FIG. 3 illustrates a cross-sectional view of some other embodiments of the semiconductor device of FIG. 2.

FIG. 3 illustrates a cross-sectional view of some other embodiments of the semiconductor device 100 of FIG. 2.

As shown in FIG. 3, a plurality of fluid communication channels 302 are disposed in the fourth dielectric structure 130. For readability, only some of the fluid communication channels 302 are specifically labeled. The fluid communication channels 302 extend laterally between the cavities 148, such that each of the cavities 148 are in fluid communication with one another. In some embodiments, each of the fluid communication channels 302 extend laterally between two neighboring cavities of the cavities 148, such that each of the cavities 148 are in fluid communication with one another. Because the cavities 148 are in fluid communication with one another, cavity pressures of the cavities 148 (e.g., pressures inside the cavities 148) are substantially the same. Because the cavity pressures are substantially the same, device performance of the semiconductor device 100 may be improved (e.g., increased transmission/receiving sensitivity).

For example, the first MEMS device 146a and the second MEMS device 146b may be a configured to operate in conjunction with one another (e.g., a CMUT configured to operate as an ultrasonic receiver and a PMUT configured to operate as an ultrasonic transmitter). During operation of the first MEMS device 146a and the second MEMS device 146b, a same operating voltage may be applied to the first MEMS device 146a and the second MEMS device 146b. As such, a difference in the cavity pressures of the first MEMS device 146a and the second MEMS device 146b may decrease the transmission sensitivity and/or receiving sensitivity due to the difference in the cavity pressures causing variations in the deflections of the movable membranes 150. However, because the fluid communication channels 302 extend laterally between the cavities 148, such that each of the cavities 148 are in fluid communication with one another, the cavity pressures of the cavities 148 are substantially the same. Thus, the fluid communication channels 302 may increase the transmission sensitivity and/or receiving sensitivity of the MEMS devices 146.

The fluid communication channels 302 are at least partially defined by the MEMS substrate 136 and the fourth dielectric structure 130. In some embodiments, a bottom surface of the first MEMS structure 217 defines upper surfaces of the fluid communication channels 302. In other embodiments, a bottom surface of the second MEMS structure 218 defines upper surfaces of the fluid communication channels 302. In some embodiments, sidewalls of the fluid communication channels 302 are defined by sidewalls of the second dielectric layer 134 and the second outgassing prevention layer 216. In further embodiments, lower surfaces of the fluid communication channels 302 are defined by upper surfaces of the first dielectric layer 132.

Figure 4:
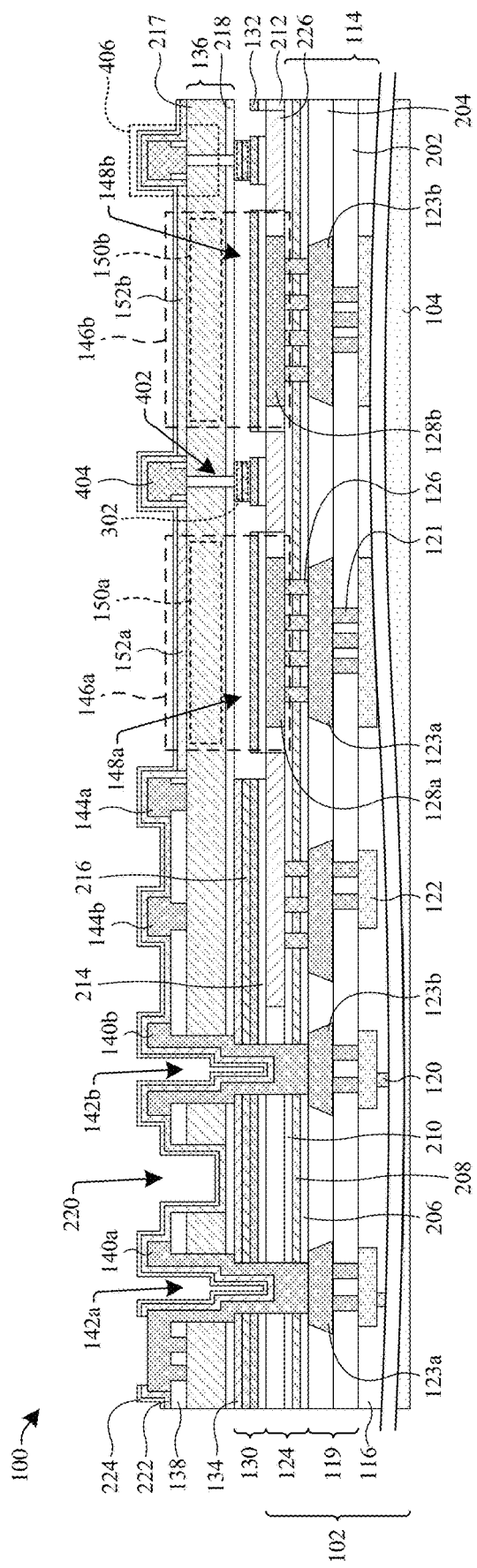
FIG. 4 illustrates a cross-sectional view of some other embodiments of the semiconductor device of FIG. 2.

FIG. 4 illustrates a cross-sectional view of some other embodiments of the semiconductor device 100 of FIG. 2.

As shown in FIG. 4, one or more vent holes 402 are disposed in the MEMS substrate 136. The vent holes 402 extend vertically through the MEMS substrate 136, such that the vent holes 402 are in fluid communication with the cavities 148. In some embodiments, the vent holes 402 are in fluid communication with the cavities 148 and the fluid communication channels 302. In further embodiments, the vent holes 402 extend vertically through the MEMS substrate 136 and open up into the fluid communication channels 302, respectively. In other embodiments, the vent holes 402 extend vertically through the MEMS substrate 136 and open up into the cavities 148, respectively. The vent holes 402 are at least partially defined by the MEMS substrate 136. For example, sidewalls of the vent holes 402 are at least partially defined by sidewalls of the first MEMS structure 217 and sidewalls of the second MEMS structure 218. For readability, only some of the vent holes 402 are specifically labeled.

One or more plugs 404 are disposed over the MEMS substrate 136 and cover the vent holes 402. For readability, only some of the plugs 404 are specifically labeled. The plugs 404 completely cover the vent holes 402, respectively. The plugs 404 are configured to hermetically seal the cavities 148 and the vent holes 402 at a reference system pressure. In some embodiments, the plugs 404 are configured to hermetically seal the cavities 148, the fluid communication channels 302, and the vent holes 402 at the reference system pressure.

In some embodiments, the reference system pressure is less than or equal to 2 standard atmosphere (atm). In further embodiments, the reference system pressure may be less than 0.1 atm (e.g., for a high-vacuum MEMS device). In yet further embodiments, the reference system pressure may be between 0.5 atm and 2 atm (e.g., for a standard pressure MEMS device). In comparison to a semiconductor device not comprising vent holes 402, the vent holes 402 allow the cavities 148, the fluid communication channels 302, and the vent holes 402 to be hermetically sealed at a lower reference system pressure due to the plugs 404 being able to be formed at a lower pressure than the MEMS substrate 136 can be bonded to the fourth dielectric structure 130. In some embodiments in which the semiconductor device 100 comprises the vent holes 402 and the plugs 404, the reference system pressure may be less than 0.1 atm.

In some embodiments, the plugs 404 may be or comprise, for example, a metal (e.g., Al, Cu, AlCu, Ti, Ag, Au, or the like), a metal nitride (e.g., TiN), an oxide (e.g., $SiO_2$), a nitride (e.g., SiN), an oxy-nitride (e.g., $SiO_xN_y$), a semiconductor material (e.g., amorphous silicon, Ge, etc.), some other suitable material for covering and sealing the vent holes 402, or a combination of the foregoing. In further embodiments, the plugs 404 may be a same material as the second conductive contacts 144. In yet further embodiments, the plugs 404 are part of the first MEMS routing structure and/or the second MEMS routing structure.

Figure 5A:
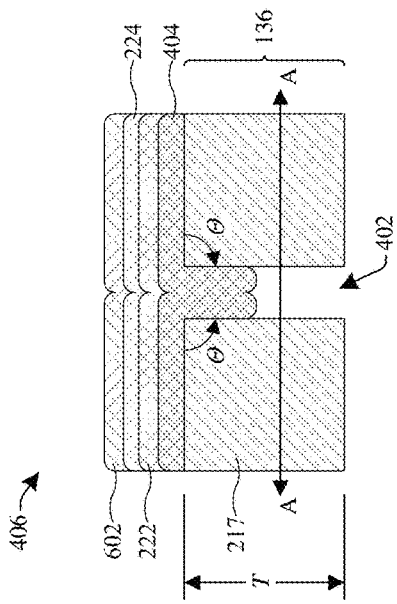
FIGS. 5A-5B illustrate various views of some embodiments of an area of the semiconductor device of FIG. 4.
Figure 5B:
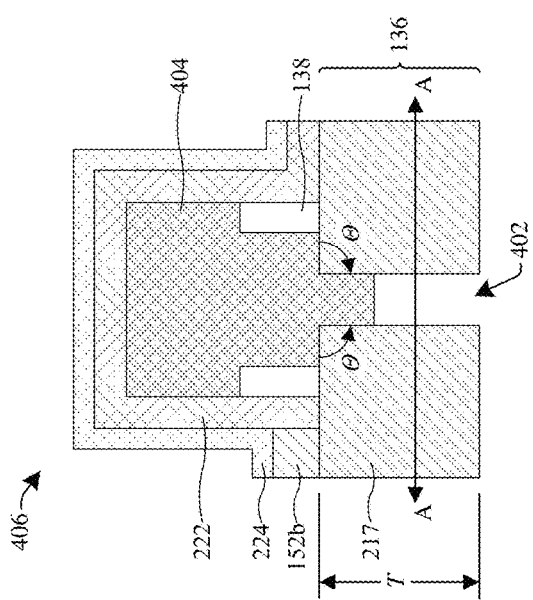

FIGS. 5A-5B illustrate various views of some embodiments of an area 406 (see, e.g., FIG. 4) of the semiconductor device 100 of FIG. 4. FIG. 5A illustrates a cross-sectional view of some embodiments of the area 406 of the semiconductor device 100 of FIG. 4. FIG. 5B illustrates a cross-sectional view of some embodiments of the area 406 taken along line A-A of FIG. 5A.

As shown in FIGS. 5A-5B, the MEMS substrate 136 has a thickness T (e.g., a distance between an uppermost surface of the MEMS substrate 136 and a bottommost surface of the MEMS substrate 136). The thickness T of the MEMS substrate may be between about 0.1 micrometers (um) and about 50 um. The vent holes 402 each have a minimum dimension D. The minimum dimension D of a given vent hole is a distance between nearest opposite sidewalls of the given vent hole. In some embodiments, the minimum dimension D is between about 0.1 um and about 2 um. In some embodiments in which the MEMS substrate 136 comprises or is a semiconductor material (e.g., Si), the minimum dimension D is at least twenty times less than the thickness T of the MEMS substrate 136. In further embodiments, the sidewalls of the vent holes 402 extend downward from an uppermost surface of the MEMS substrate 136 at an angle Θ. The angle Θ may be between about 85 degrees and 95 degrees.

Figure 6A:
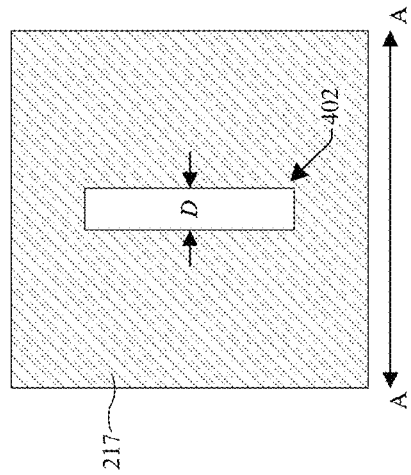
FIGS. 6A-6B illustrate various views of some other embodiments of the area of the semiconductor device of FIG. 4.
Figure 6B:
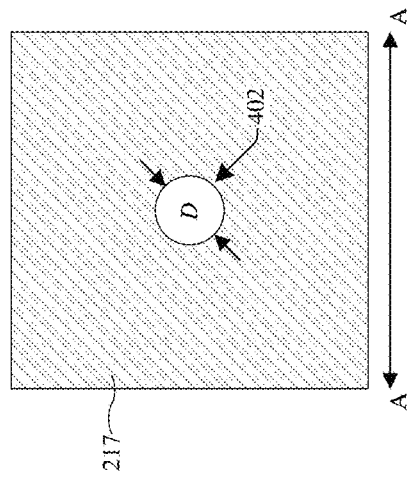

FIGS. 6A-6B illustrate various views of some other embodiments of the area 406 (see, e.g., FIG. 4) of the semiconductor device 100 of FIG. 4. FIG. 6A illustrates a cross-sectional view of some embodiments of the area 406 of the semiconductor device 100 of FIG. 4. FIG. 6B illustrates a cross-sectional view of some embodiments of the area 406 taken along line A-A of FIG. 6A.

As shown in FIGS. 6A-6B, a third passivation layer 602 may be disposed over the second passivation layer 224. In some embodiments, the third passivation layer 602 is disposed over the MEMS substrate 136, the third dielectric layer 138, the fourth conductive vias 140, the second conductive contacts 144, the first passivation layer 222, the functional structures 152, and the second passivation layer 224. The third passivation layer 602 may be or comprise, for example, an oxide (e.g., $SiO_2$), a nitride (e.g., SiN), an oxy-nitride (e.g., $SiO_xN_y$), some other dielectric material, or a combination of the foregoing. In some embodiments, the third passivation layer 602 may be or comprise a same material as the first passivation layer 222. For example, the first passivation layer 222 may be an oxide (e.g., $SiO_2$), the second passivation layer 224 may be a nitride (e.g., SiN), and the third passivation layer 602 may be an oxide (e.g., $SiO_2$).

In some embodiments, one or more of the plugs 404 may have a first indentation. The first indentation is disposed along a bottom surface of the one or more plugs 404. The one or more plugs 404 may have a second indentation that corresponds to the first indentation. The second indentation is disposed along an upper surface of the one or more plugs 404. In other embodiments, the upper surfaces of the plugs 404 may be substantially planar.

The first passivation layer 222 may have a third indentation that corresponds to the second indentation. The third indentation is disposed along an upper surface of the first passivation layer 222. The second passivation layer 224 may have a fourth indentation that corresponds to the third indentation. The fourth indentation is disposed along an upper surface of the second passivation layer 224. The third passivation layer 602 may have a fifth indentation that corresponds to the fourth indentation. The fifth indentation is disposed along an upper surface of the third passivation layer 602. In other embodiments, the upper surface of the first passivation layer 222, the upper surface of the second passivation layer 224, and/or the upper surface of the third passivation layer 602 may be substantially planar.

Figure 7:
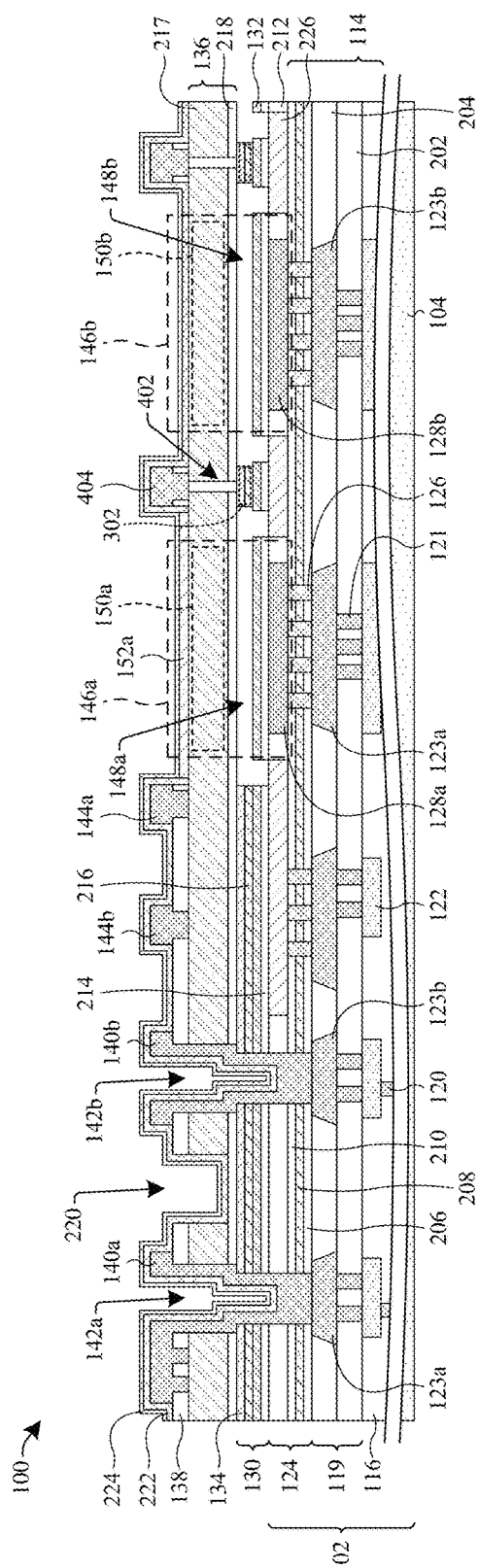
FIG. 7 illustrates a cross-sectional view of some other embodiments of the semiconductor device of FIG. 2.

FIG. 7 illustrates a cross-sectional view of some other embodiments of the semiconductor device 100 of FIG. 2.

As shown in FIG. 7, some of the MEMS devices 146 may comprise functional structures 152, and some other of the MEMS devices 146 may not comprise functional structures 152. For example, the first MEMS device 146a comprises the first functional structure 152a, but the second MEMS device 146b does not comprise the second functional structure 152b. Because the first MEMS device 146a comprises the first functional structure 152a, the first MEMS device 146a may sense (or actuate) based at least in part on a physical property of the first functional structure 152a changing in response to a stimulus (e.g., a shape of the first functional structure 152a changing in response to a stimulus causing the first movable membrane 150a to deflect). Because the second MEMS device 146b does not comprise the second functional structure 152b, the second MEMS device 146b does not rely on a physical property of a respective functional structure changing in repose to a stimulus to sense (or actuate). Rather, the second MEMS device 146b may sense (or actuate) based on a stimulus directly causing the second movable membrane 150b to deflect (e.g., rather than indirectly deflecting based on a physical property of the respective functional structure causing the second movable membrane 150b to deflect). Thus, the first MEMS device 146a is a first type of MEMS device and the second MEMS device 146b is a second type of MEMS device different than the first type. Accordingly, the semiconductor device 100 comprises different types of MEMS devices, which may reduce manufacturing costs, reduce packaging sizes, reduce power consumption, etc.

In some embodiments, the first passivation layer 222 may be vertically spaced from the first movable membrane 150a and contact the second movable membrane 150b. In further embodiments, the first passivation layer 222 may have a first bottom surface disposed directly over the first movable membrane 150a and a second bottom surface disposed directly over the second movable membrane 150b. In yet further embodiments, the second bottom surface of the first passivation layer 222 may be disposed between the first bottom surface of the first passivation layer 222 and an upper surface of the first movable membrane.

In some embodiments, the first functional structure 152a may vertically separate the first passivation layer 222 from the first movable membrane 150a. In such embodiments, the first passivation layer 222 may line an upper surface of the first functional structure 152a directly over the first movable membrane 150a and line an upper surface of the second movable membrane 150b. In other embodiments, the third dielectric layer 138 may line the upper surface of the second movable membrane 150b. In such embodiments, the first passivation layer 222 may line the upper surface of the first functional structure 152a directly over the first movable membrane 150a and line an upper surface of the third dielectric layer 138 directly over the second movable membrane 150b.

Figure 8:
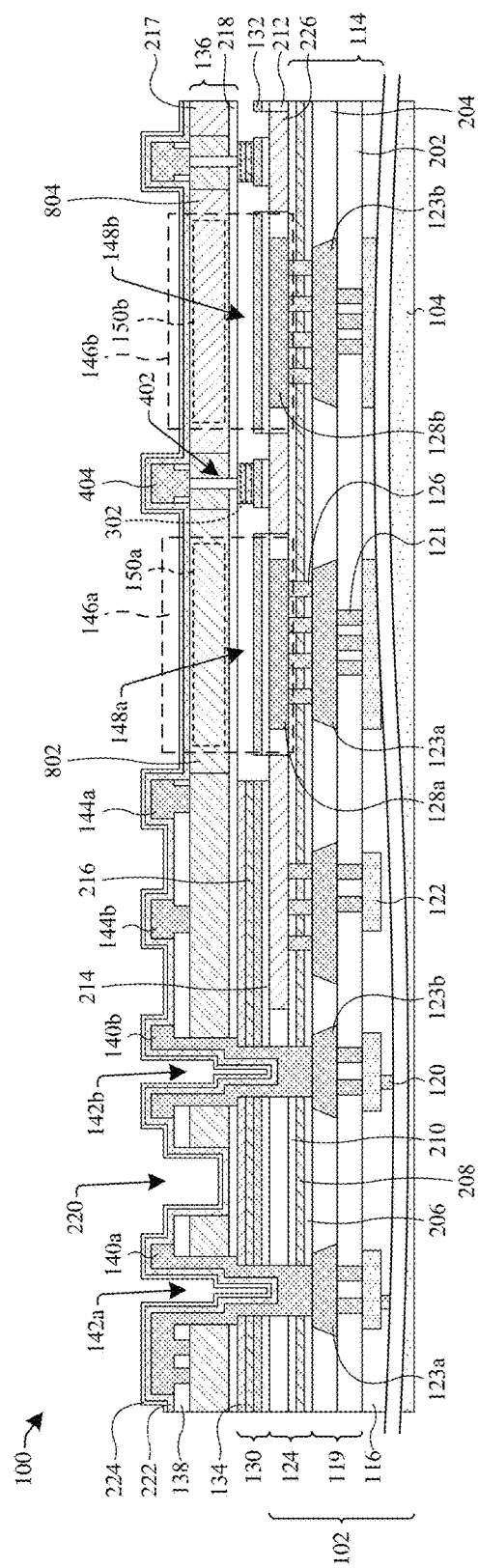
FIG. 8 illustrates a cross-sectional view of some other embodiments of the semiconductor device of FIG. 2.

FIG. 8 illustrates a cross-sectional view of some other embodiments of the semiconductor device 100 of FIG. 2.

As shown in FIG. 8, a first doped region 802 and a second doped region 804 are disposed in the MEMS substrate 136. The first doped region 802 is disposed at least partially in the first movable membrane 150a, and the second doped region 804 is disposed at least partially in the second movable membrane 150b. In some embodiments, the first doped region 802 and the second doped region 804 are disposed in the first MEMS structure 217.

The first doped region 802 has a first doping type (e.g., n-type/p-type) and the second doped region has a second doping type (e.g., n-type/p-type). In some embodiments, the first doping type and the second doping type are the same. In such embodiments, the first doped region 802 has a first doping concentration of first doping type dopants (e.g., phosphorus (n-type), boron (p-type), etc.), and the second doped region 804 has a second doping concertation of the first doping type dopants that is different than the first doping concentration. In other embodiments, the first doping type and the second doping type are the different.

Also shown in FIG. 8, the first MEMS device 146a does not comprise the first functional structure 152a and the second MEMS device 146b does not comprise the second functional structure 152b. However, because the first doped region 802 is at least partially disposed in the first movable membrane 150a and the second doped region 804 is at least partially disposed in the second movable membrane 150b, the first MEMS device 146a may be a different type of MEMS device than the second MEMS device 146b. For example, due to the first doped region 802 having the first doping type (and/or first doping concentration) and the second doped region 804 having the second doping type (and/or second doping concentration), the first MEMS device 146a may be configured to transmit (or sense) acoustic waves at a first frequency while the second MEMS device 146b is configured to transmit (or sense) acoustic waves at a second frequency different than the first frequency. Thus, the first MEMS device 146a is a first type of MEMS device and the second MEMS device 146b is a second type of MEMS device different than the first type. Accordingly, the semiconductor device 100 comprises different types of MEMS devices, which may reduce manufacturing costs, reduce packaging sizes, reduce power consumption, etc.

Figure 9:
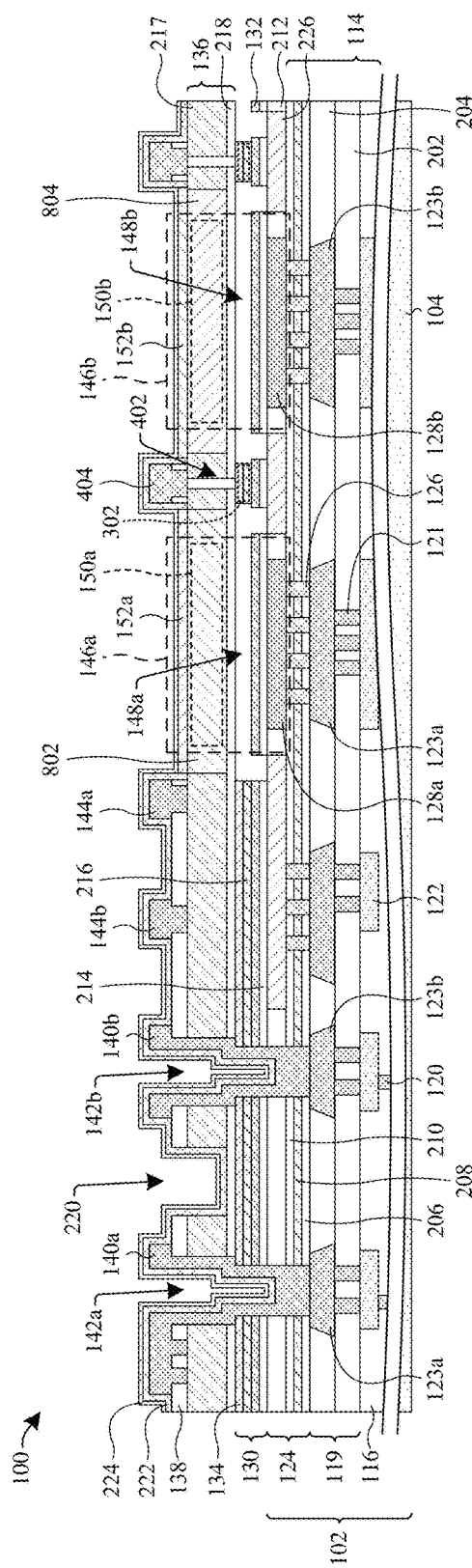
FIG. 9 illustrates a cross-sectional view of some other embodiments of the semiconductor device of FIG. 2.

FIG. 9 illustrates a cross-sectional view of some other embodiments of the semiconductor device 100 of FIG. 2.

As shown in FIG. 9, the first MEMS device 146a comprises the first functional structure 152a and the first doped region 802 is disposed in the MEMS substrate 136. The second MEMS device 146b comprises the second functional structure 152b and the second doped region 804 is disposed in the MEMS substrate 136. In some embodiments in which the first doped region 802 and the second doped region 804 are disposed in the MEMS substrate 136, the second functional structure 152b may have a same chemical composition as the first functional structure 152a. While the first functional structure 152a and the second functional structure 152b may have a same chemical composition, the first MEMS device 146a and the second MEMS device 146b may still be different types of MEMS devices due to the first doped region 802 having the first doping type (and/or first doping concentration) and the second doped region 804 having the second doping type (and/or second doping concentration). In other embodiments in which the first doped region 802 and the second doped region 804 are disposed in the MEMS substrate 136, the first functional structure 152a may have a different chemical composition than the second functional structure 152b. It will be appreciated that, in some embodiments, the first MEMS device 146a and the second MEMS device 146b may be different types of MEMS devices due to the first functional structure 152a and the second functional structure 152b having different chemical compositions, the first doped region 802 and the second doped region 804 having different doping types (and/or doping concentrations), the first MEMS device 146a comprising the first functional structure 152a and the second MEMS device not comprising the second functional structure 152b, or a combination of the foregoing.

Figure 10:
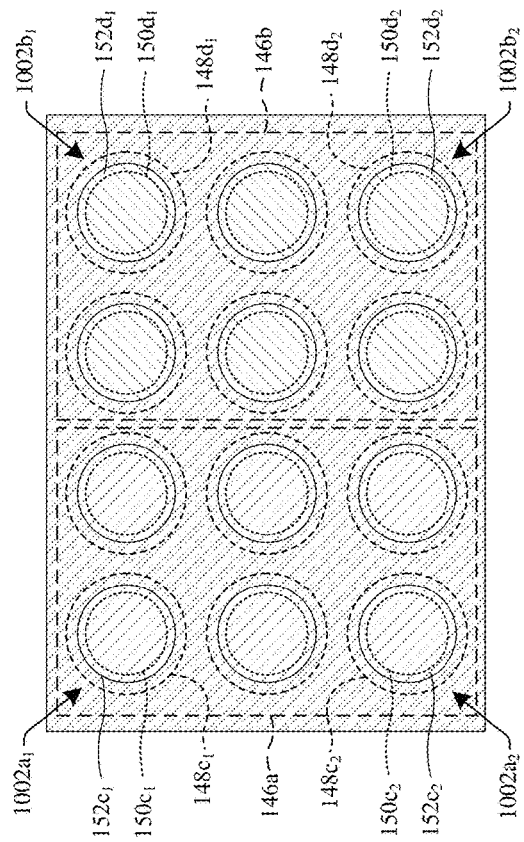
FIG. 10 illustrates a simplified layout view of some embodiments of the semiconductor device of FIG. 2.

FIG. 10 illustrates a simplified layout view of some embodiments of the semiconductor device 100 of FIG. 2. FIG. 10 is "simplified" because various features illustrated in FIG. 2 are not illustrated in FIG. 10.

As shown in FIG. 10, in some embodiments, the first MEMS device 146a comprises a first plurality of MEMS cells 1002a. The first plurality of MEMS cells 1002a comprises a second plurality of cavities 148c, respectively. For example, a first MEMS cell $1002a_1$ of the first plurality of MEMS cells 1002a comprises a third cavity $148c_1$ of the second plurality of cavities 148c, and a second MEMS cell $1002a_2$ of the first plurality of MEMS cells 1002a comprises a fourth cavity $148c_2$ of the second plurality of cavities 148c. In some embodiments, the cavities of the second plurality of cavities 148c have substantially similar structures as one another.

The first plurality of MEMS cells 1002a comprises a second plurality of movable membranes 150c, respectively. For example, the first MEMS cell $1002a_1$ comprises a third movable membrane $150c_1$ of the second plurality of movable membranes 150c, and the second MEMS cell $1002a_2$ comprises a fourth movable membrane $150c_2$ of the second plurality of movable membranes 150c. In some embodiments, the movable membranes of the second plurality of movable membranes 150c have substantially similar structures (and/or doping types/concentrations) as one another.

In some embodiments, the first plurality of MEMS cells 1002a comprises a first plurality of functional structures 152c, respectively. For example, the first MEMS cell $1002a_1$ comprises a third functional structure $152c_1$ of the first plurality of functional structures 152c, and the second MEMS cell $1002a_2$ comprises a fourth functional structure $152c_2$ of the first plurality of functional structures 152c. In some embodiments, the functional structures of the first plurality of functional structures 152c have substantially similar structures as one another. In further embodiments, each of the functional structures of the first plurality of functional structures 152c may have a same chemical composition. In yet further embodiments, each of the functional structures of the first plurality of functional structures 152c have a same chemical composition as the first functional structure 152a.

In some embodiments, the first plurality of MEMS cells 1002a are configured to operate in conjunction with one another (e.g., in unison). For example, the first MEMS device 146a may be a CMUT, and the first plurality of MEMS cells 1002a are individual cells of the CMUT. In further embodiments, during operation of the first MEMS device 146a, a same operating voltage may be applied to each of the first plurality of MEMS cells 1002a.

The second MEMS device 146b may comprise a second plurality of MEMS cells 1002b. The second plurality of MEMS cells 1002b comprises a third plurality of cavities 148d, respectively. For example, a third MEMS cell $1002b_1$ of the second plurality of MEMS cells 1002b comprises a fifth cavity $148d_1$ of the third plurality of cavities 148d, and a fourth MEMS cell $1002b_2$ of the second plurality of MEMS cells 1002b comprises a sixth cavity $148d_2$ of the third plurality of cavities 148d. In some embodiments, the cavities of the third plurality of cavities 148d have substantially similar structures as one another.

The second plurality of MEMS cells 1002b comprises a third plurality of movable membranes 150d, respectively. For example, the third MEMS cell $1002b_1$ comprises a fifth movable membrane $150d_1$ of the third plurality of movable membranes 150d, and the fourth MEMS cell $1002b_2$ comprises a sixth movable membrane $150d_2$ of the third plurality of movable membranes 150d. In some embodiments, the movable membranes of the third plurality of movable membranes 150d have substantially similar structures (and/or doping types/concentrations) as one another.

In some embodiments, the second plurality of MEMS cells 1002b comprises a second plurality of functional structures 152d, respectively. For example, the third MEMS cell $1002b_1$ comprises a fifth functional structure $152d_1$ of the second plurality of functional structures 152d, and the fourth MEMS cell $1002b_2$ comprises a sixth functional structure $152d_2$ of the second plurality of functional structures 152d. In some embodiments, the functional structures of the second plurality of functional structures 152d have substantially similar structures as one another. In further embodiments, each of the functional structures of the second plurality of functional structures 152d may have a same chemical composition. In yet further embodiments, each of the functional structures of the second plurality of functional structures 152d have a same chemical composition as the second functional structure 152b.

In some embodiments, the second plurality of MEMS cells 1002b are configured to operate in conjunction with one another (e.g., in unison). For example, the second MEMS device 146b may be a PMUT, and the second plurality of MEMS cells 1002b are individual cells of the PMUT. In further embodiments, during operation of the second MEMS device 146b, a same operating voltage may be applied to each of the second plurality of MEMS cells 1002b.

FIGS. 11-22 illustrate a series of cross-sectional views of some embodiments of a method for forming some embodiments of the semiconductor device 100 of FIG. 4.

Figure 11:
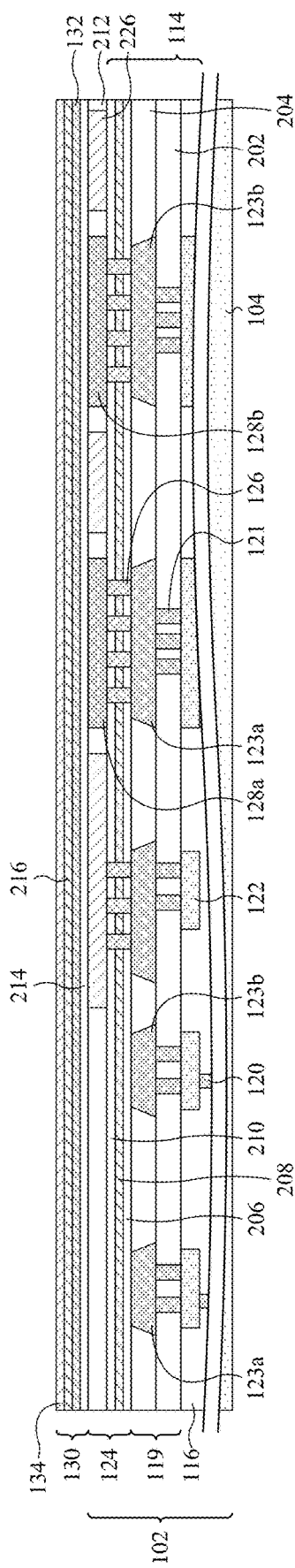
FIGS. 11-22 illustrate a series of cross-sectional views of some embodiments of a method for forming some embodiments of the semiconductor device of FIG. 4.

As shown in FIG. 11, an IC structure 102 is provided. The IC structure 102 comprises a semiconductor substrate 104. One or more IC devices 106 (not shown) are formed on/over the semiconductor substrate 104. In some embodiments, one or more of the IC devices 106 comprise a pair of source/drain regions 108, a gate dielectric 110, and a gate electrode 112. The IC structure 102 comprises an interconnect structure 114, a first dielectric structure 116, a second dielectric structure 119, a third dielectric structure 124, a plurality of electrodes 128, and one or more gas getter structures 226 disposed over the semiconductor substrate 104 and the IC devices 106. The interconnect structure 114 comprises one or more first conductive contacts 118 (not shown), one or more first conductive vias 120, one or more first conductive lines 122, a plurality of second conductive vias 121, a plurality of second conductive lines 123, and a plurality of third conductive vias 126. The second dielectric structure 119 comprises a fourth dielectric layer 202 and a fifth dielectric layer 204. The third dielectric structure 124 comprises a sixth dielectric layer 206, a first outgassing prevention layer 208, a seventh dielectric layer 210, and an eighth dielectric layer 212. The IC structure 102 may be formed according to a CMOS manufacturing process.

Also shown in FIG. 11, a fourth dielectric structure 130 is formed over the IC structure 102. In some embodiments, the fourth dielectric structure 130 is formed over the third dielectric structure 124, the gas getter structures 226, and the electrodes 128. The fourth dielectric structure 130 may comprise a ninth dielectric layer 214, a first dielectric layer 132, a second outgassing prevention layer 216, and a second dielectric layer 134. The ninth dielectric layer 214 may be formed over the third dielectric structure 124, the gas getter structures 226, and the electrodes 128. The first dielectric layer 132 may be formed over the ninth dielectric layer 214. The second outgassing prevention layer 216 may be formed over the first dielectric layer 132. The second dielectric layer 134 may be formed over the second outgas sing prevention layer 216.

In some embodiments, a process for forming the fourth dielectric structure 130 comprises depositing the ninth dielectric layer 214 on and covering the third dielectric structure 124, the gas getter structures 226, and the electrodes 128. The ninth dielectric layer 214 may be deposited by, for example, chemical vapor deposition (CVD), physical vapor deposition (PVD), atomic layer deposition (ALD), some other deposition process, or a combination of the foregoing. Thereafter, the first dielectric layer 132 is deposited over the ninth dielectric layer 214. The first dielectric layer 132 may be deposited by, for example, CVD, PVD, ALD, some other deposition process, or a combination of the foregoing.

The second outgassing prevention layer 216 is then deposited over the first dielectric layer 132. The second outgassing prevention layer 216 may be deposited by, for example, CVD, PVD, ALD, some other deposition process, or a combination of the foregoing. Thereafter, the second dielectric layer 134 is deposited over the second outgassing prevention layer 216. The second dielectric layer 134 may be deposited by, for example, CVD, PVD, ALD, some other deposition process, or a combination of the foregoing. In some embodiments, the second dielectric layer 134 may be deposited with a thickness between about 0.1 um to about 10 um. In further embodiments, the ninth dielectric layer 214, the first dielectric layer 132, the second outgassing prevention layer 216, and/or the second dielectric layer 134 may be formed as conformal layers.

Figure 12:
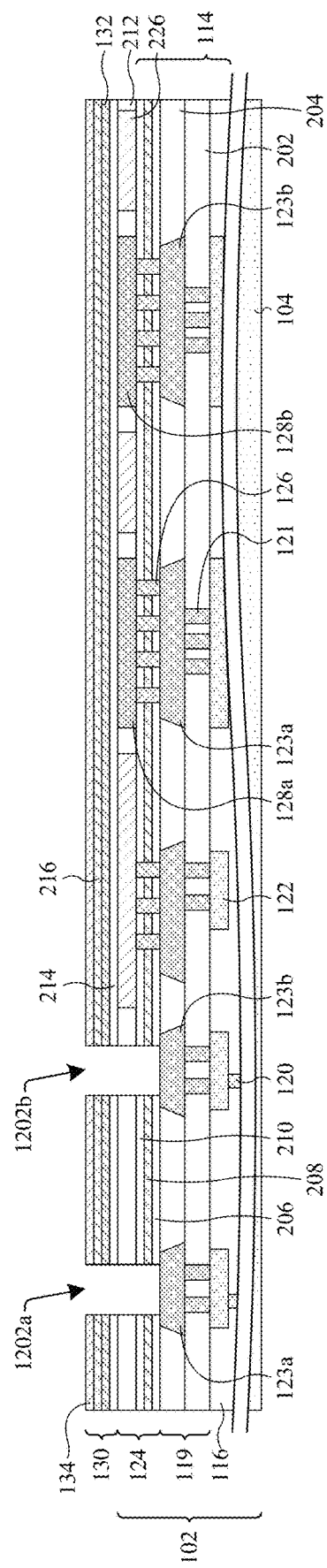

As shown in FIG. 12, a first plurality of openings 1202 are formed over the second dielectric structure 119. The first plurality of openings 1202 are formed laterally spaced from one another. In some embodiments, the first plurality of openings 1202 are formed at least partially in the third dielectric structure 124 and at least partially in the fourth dielectric structure 130. In further embodiments, the first plurality of openings 1202 expose one or more of the second conductive lines 123. For example, in some embodiments, a first opening 1202a of the first plurality of openings 1202 exposes the third conductive line 123a, and a second opening 1202b of the first plurality of openings 1202 exposes the fourth conductive line 123b.

In some embodiments, a process for forming the first plurality of openings 1202 comprises forming a first patterned masking layer (not shown) (e.g., positive/negative photoresist, hardmask, etc.) over the fourth dielectric structure 130. In further embodiments, the first patterned masking layer may be formed by forming a masking layer (not shown) on the fourth dielectric structure 130, exposing the masking layer to a pattern (e.g., via a lithography process, such as photolithography, extreme ultraviolet lithography, or the like), and developing the masking layer to form the first patterned masking layer. Thereafter, a first etching process is performed to remove unmasked portions of the fourth dielectric structure 130 and the third dielectric structure 124, thereby forming the first plurality of openings 1202 over the second dielectric structure 119. The first etching process may be a dry etching process, a wet etching process, a reactive ion etching (RIE) process, some other etching process, or a combination of the foregoing. Subsequently, in some embodiments, the first patterned masking layer is stripped away.

Figure 13:
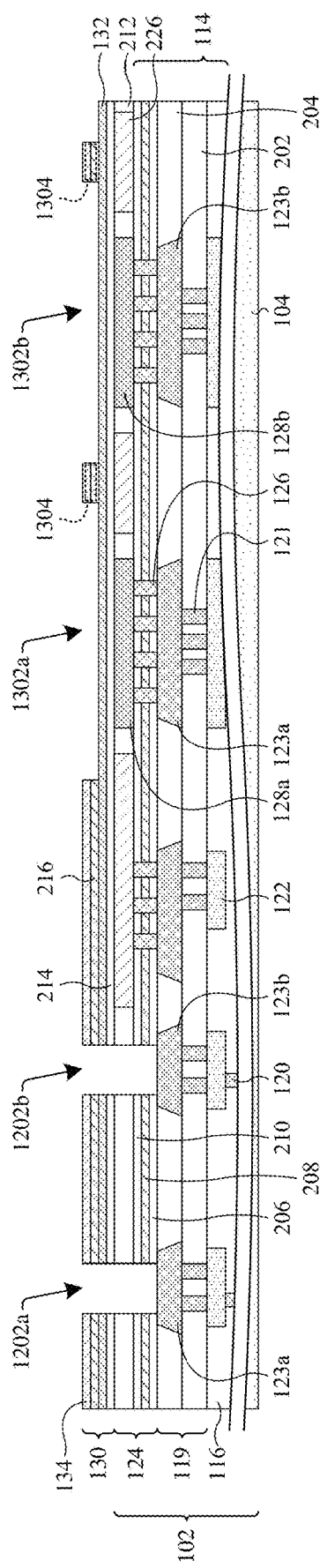

As shown in FIG. 13, a plurality of cavity openings 1302 and a plurality of fluid communication channel openings 1304 are formed over the IC structure 102. The cavity openings 1302 and the fluid communication channel openings 1304 are formed in the fourth dielectric structure 130. In some embodiments, the cavity openings 1302 and the fluid communication channel openings 1304 are defined at least partially by the first dielectric layer 132, the second dielectric layer 134, and the second outgassing prevention layer 216.

The cavity openings 1302 are formed laterally spaced from one another. The cavity openings 1302 are formed over the electrodes 128, respectively. For example, a first cavity opening 1302a of the cavity openings 1302 is formed over the first electrode 128a, and a second cavity opening 1302b of the cavity openings 1302 is formed over the second electrode 128b. The fluid communication channel openings 1304 are formed extending laterally between the cavity openings 1302, such that opposite ends of the fluid communication channel openings 1304 open up into corresponding cavity openings of the cavity openings 1302. In some embodiments, each of the fluid communication channel openings 1304 are formed extending laterally between two neighboring cavity openings of the cavity openings 1302, such that the opposite ends of each of the fluid communication channel openings 1304 open up into two neighboring cavity openings of the cavity openings 1302.

In some embodiments, a process for forming the cavity openings 1302 and the fluid communication channel openings 1304 comprises forming a second patterned masking layer (not shown) (e.g., positive/negative photoresist, hardmask, etc.) over the fourth dielectric structure 130, over the second conductive lines 123, and in the first plurality of openings 1202. Thereafter, a second etching process is performed to remove unmasked portions of the second dielectric layer 134 and the second outgas sing prevention layer 216, thereby forming the cavity openings 1302 and the fluid communication channel openings 1304 in the fourth dielectric structure 130. The second etching process may be a dry etching process, a RIE process, a wet etching process, some other etching process, or a combination of the foregoing. Subsequently, in some embodiments, the second patterned masking layer is stripped away.

Figure 14:
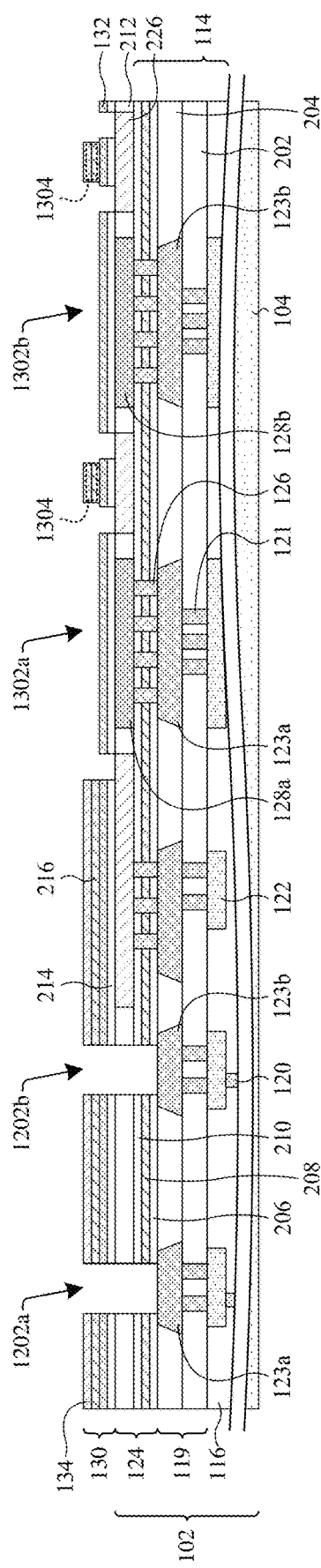

As shown in FIG. 14, portions of the fourth dielectric structure 130 are removed to at least partially expose the gas getter structures 226. In some embodiments, portions of the first dielectric layer 132 and portions of the ninth dielectric layer 214 are removed to at least partially expose the gas getter structures 226. In some embodiments, a process for removing the portions of the fourth dielectric structure 130 to at least partially expose the gas getter structures 226 comprises forming a third patterned masking layer (not shown) (e.g., positive/negative photoresist, hardmask, etc.) over the fourth dielectric structure 130, over the second conductive lines 123, in the first plurality of openings 1202, in the cavity openings 1302, and in the fluid communication channel openings 1304. Thereafter, a third etching process is performed to remove unmasked portions of the fourth dielectric structure 130, thereby at least partially exposing the gas getter structures 226. The third etching process may be a dry etching process, a RIE process, a wet etching process, some other etching process, or a combination of the foregoing. Subsequently, in some embodiments, the third patterned masking layer is stripped away.

Figure 15:
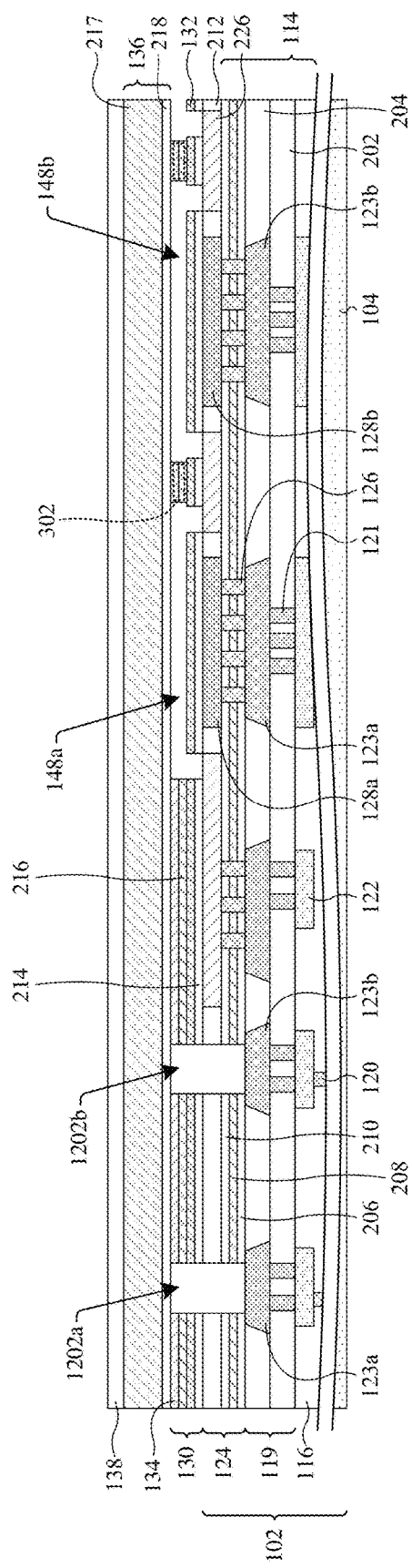

As shown in FIG. 15, a MEMS substrate 136 is bonded to the fourth dielectric structure 130. By bonding the MEMS substrate 136 to the fourth dielectric structure 130, a plurality of cavities 148 and a plurality of fluid communication channels 302 are formed over the IC structure 102. For example, once the MEMS substrate 136 is bonded to the fourth dielectric structure 130, the MEMS substrate 136 completely covers the cavity openings 1302 and the fluid communication channel openings 1304 (see, e.g., FIG. 14), thereby forming the plurality of cavities 148 and the plurality of fluid communication channels 302, respectively. In some embodiments, bonding the MEMS substrate 136 to the fourth dielectric structure 130 covers the first plurality of openings 1202.

In some embodiments, the MEMS substrate 136 is bonded to the fourth dielectric structure 130 via a fusion bonding process. It will be appreciated that other types of bonding process (e.g., eutectic bonding) may be utilized to bond the MEMS substrate 136 to the fourth dielectric structure 130. In further embodiments, the MEMS substrate 136 is bonded to the second dielectric layer 134.

The MEMS substrate 136 may comprise a first MEMS structure 217 and a second MEMS structure 218. In some embodiments, the first MEMS structure 217 may be bonded to the fourth dielectric structure 130. In other embodiments, the MEMS substrate 136 may not comprise the second MEMS structure 218. In such embodiments, the first MEMS structure 217 may be bonded to the fourth dielectric structure 130.

In some embodiments, a third dielectric layer 138 is disposed over a side of the MEMS substrate 136 that is opposite the side of the MEMS substrate 136 that is bonded to the fourth dielectric structure 130. The third dielectric layer 138 may be disposed over the side of the MEMS substrate 136 before the MEMS substrate 136 is bonded to the fourth dielectric structure 130. In other embodiments, the third dielectric layer 138 may be formed over the MEMS substrate 136 and the IC structure 102 after the MEMS substrate 136 is bonded to the third dielectric layer 138. In further embodiments, a process for forming the third dielectric layer 138 over the MEMS substrate 136 and the IC structure 102 comprises depositing or growing the third dielectric layer 138 on the MEMS substrate 136 by, for example, CVD, PVD, ALD, thermal oxidation, some other deposition or growth process, or a combination of the foregoing.

Figure 16:
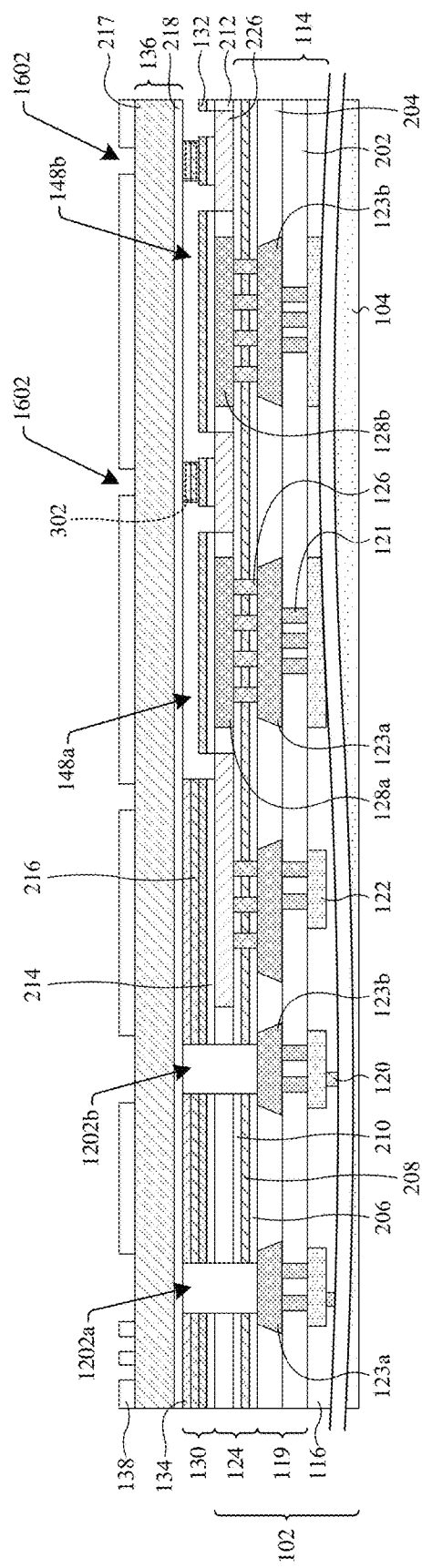

As shown in FIG. 16, a second plurality of openings 1602 are formed over the MEMS substrate 136. The second plurality of openings 1602 are formed in the third dielectric layer 138. In some embodiments, the second plurality of openings 1602 are part of one or more trenches that are disposed in the third dielectric layer 138 and extend over the MEMS substrate 136. For readability, only some of the second plurality of openings 1602 are specifically labeled.

In some embodiments, a process for forming the second plurality of openings 1602 comprises forming a fourth patterned masking layer (not shown) (e.g., positive/negative photoresist, hardmask, etc.) over the third dielectric layer 138. Thereafter, a fourth etching process is performed to remove unmasked portions of the third dielectric layer 138, thereby forming the second plurality of openings 1602. The fourth etching process may be a dry etching process, a RIE process, a wet etching process, some other etching process, or a combination of the foregoing. Subsequently, in some embodiments, the fourth patterned masking layer is stripped away.

Figure 17:
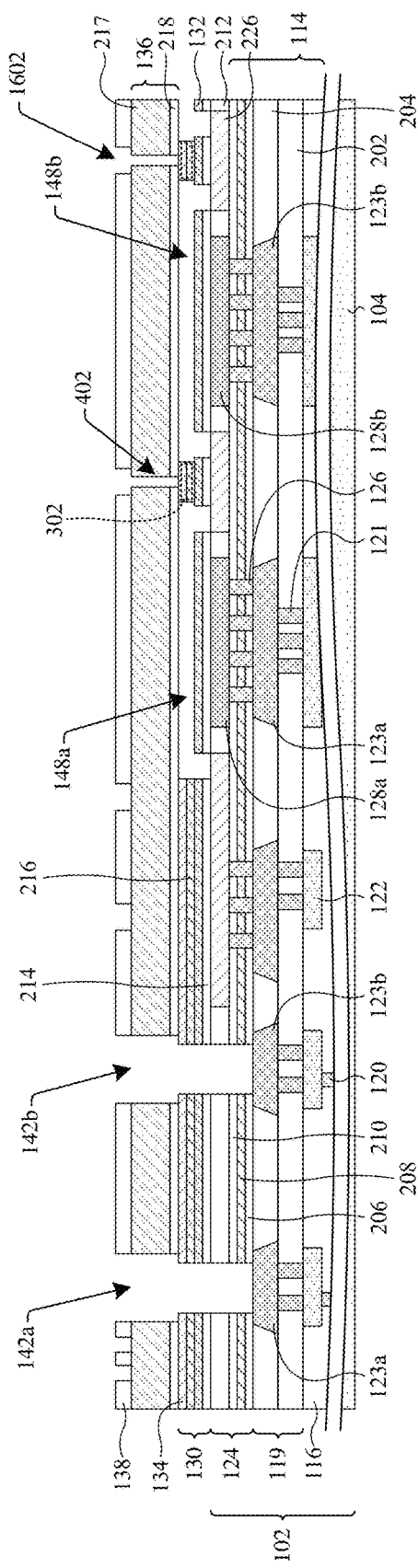

As shown in FIG. 17, a plurality of via openings 142 are formed extending vertically through the third dielectric layer 138, the MEMS substrate 136, the fourth dielectric structure 130, and the third dielectric structure 124. The via openings 142 expose one or more of the second conductive lines 123. For example, in some embodiments, a first via opening 142a of the plurality of via openings 142 exposes the third conductive line 123a, and a second via opening 142b of the plurality of via openings 142 exposes the fourth conductive line 123b.

In some embodiments, a process for forming the via openings 142 comprises forming a fifth patterned masking layer (not shown) (e.g., positive/negative photoresist, hardmask, etc.) over the third dielectric layer 138 and in some of the second plurality of openings 1602. The fifth patterned masking layer at least partially exposes some other of the second plurality of openings 1602. The openings of the second plurality of openings 1602 that are at least partially exposed by the fifth patterned masking layer correspond to the locations in which the via openings 142 are formed. Thereafter, a fifth etching process is performed to remove unmasked portions of the MEMS substrate 136, thereby forming the via openings 142. The unmasked portions of the MEMS substrate 136 that are removed to form the via openings 142 overlie the first plurality of openings 1202 (see, e.g., FIG. 16), respectively. In other words, the first plurality of openings 1202 are exposed by removing the unmasked portions of the MEMS substrate 136. The fifth etching process may be a dry etching process, a RIE process, a wet etching process, some other etching process, or a combination of the foregoing. Subsequently, in some embodiments, the fifth patterned masking layer may be stripped away. It will be appreciated that, in some embodiments, the fifth patterned masking layer may not expose the some other of the second plurality of openings 1602, but rather expose portions of the third dielectric layer 138. In such embodiments, the fifth etching process removes unmasked portions of the third dielectric layer 138 and the unmasked portions of the MEMS substrate 136, thereby forming the via openings 142.

Also shown in FIG. 17, one or more vent holes 402 are formed extending vertically through the MEMS substrate 136. In some embodiments, the vent holes 402 are formed extending vertically through the MEMS substrate 136 and opening up into the fluid communication channels 302, respectively. In other embodiments, the vent holes 402 may be formed extending vertically through the MEMS substrate 136 and opening up into the cavities 148, respectively.

In some embodiments, a process for forming the vent holes 402 comprises forming a sixth patterned masking layer (not shown) (e.g., positive/negative photoresist, hardmask, etc.) over the third dielectric layer 138 and in some of the second plurality of openings 1602. The sixth patterned masking layer at least partially exposes some other of the second plurality of openings 1602. The openings of the second plurality of openings 1602 that are at least partially exposed by the sixth patterned masking layer correspond to the locations in which the vent holes 402 are formed. Thereafter, a sixth etching process is performed to remove unmasked portions of the MEMS substrate 136, thereby forming the vent holes 402. The sixth etching process may be a dry etching process, a RIE process, a wet etching process, some other etching process, or a combination of the foregoing. Subsequently, in some embodiments, the sixth patterned masking layer may be stripped away. It will be appreciated that, in some embodiments, the fifth etching process may form the vent holes 402. It will be appreciated that, in some embodiments, the sixth patterned masking layer may not expose some other of the second plurality of openings 1602, but rather expose portions of the third dielectric layer 138. In such embodiments, the sixth etching process (or the fifth etching process) removes unmasked portions of the third dielectric layer 138 and the unmasked portions of the MEMS substrate 136, thereby forming the vent holes 402.

Figure 18:
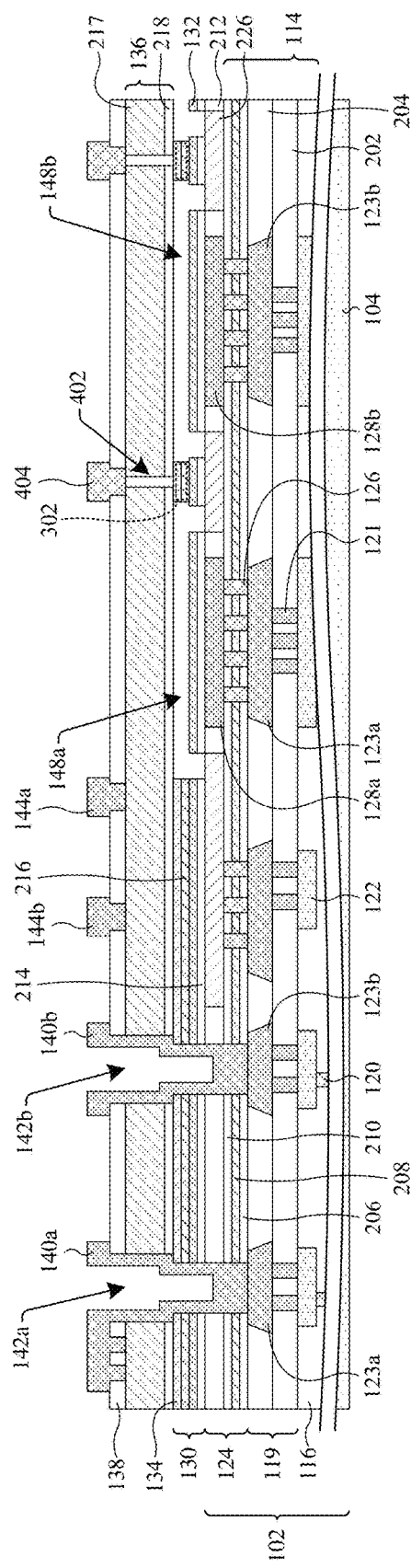

As shown in FIG. 18, a plurality of fourth conductive vias 140, a plurality of second conductive contacts 144, and one or more plugs 404 are formed over the MEMS substrate 136. The fourth conductive vias 140 are formed extending vertically through the third dielectric layer 138, the MEMS substrate 136, the fourth dielectric structure 130, and the third dielectric structure 124 to contact a corresponding one of the second conductive lines 123. For example, a fifth conductive via 140a, which is one of the fourth conductive vias 140, is formed extending vertically through the third dielectric layer 138, the MEMS substrate 136, the fourth dielectric structure 130, and the third dielectric structure 124 to contact the third conductive line 123a. A sixth conductive via 140b, which is one of the fourth conductive vias 140, is formed extending vertically through the third dielectric layer 138, the MEMS substrate 136, the fourth dielectric structure 130, and the third dielectric structure 124 to contact the fourth conductive line 123b.

The second conductive contacts 144 are formed extending through the third dielectric layer 138 and contacting the MEMS substrate 136. The plugs 404 are formed extending through the third dielectric layer 138 and contacting the MEMS substrate 136. By forming the plugs 404, the cavities 148 and the fluid communication channels 302 are hermetically sealed at a reference system pressure (e.g., less than or equal to 2 atm). In some embodiments in which the vent holes 402 are formed, the reference system pressure may be less than 0.1 atm (e.g., for a high-vacuum MEMS device). It will be appreciated that, in some embodiments in which the vent holes 402 are not formed, the cavities 148 and the fluid communication channels 302 may be hermetically sealed by bonding the MEMS substrate 136 to the fourth dielectric structure 130.

In some embodiments, a process for forming the fourth conductive vias 140, the second conductive contacts 144, and the plugs 404 comprises depositing a conductive layer (not shown) over the third dielectric layer 138, over the second conductive lines 123, in the via openings 142, and in the second plurality of openings 1602. In further embodiments, the conductive layer is deposited at least partially in the vent holes 402. The conductive layer may be, for example, a metal (e.g., Al, Cu, AlCu, Ti, Ag, Au, or the like), a metal nitride (e.g., TiN), some other conductive material, or a combination of the foregoing. The conductive layer may be deposited by, for example, CVD, PVD, ALD, electroless plating, electrochemical plating, some other deposition process, or a combination of the foregoing. In some embodiments, the conductive layer may be deposited as a conformal layer. In further embodiments, the conductive layer may be formed having a thickness between about 0.05 um and about 1 um.

A seventh patterned masking layer (not shown) (e.g., positive/negative photoresist, hardmask, etc.) is then formed over the conductive layer. A seventh etching process is then performed on the conductive layer to remove unmasked portions of the conductive layer, thereby forming the fourth conductive vias 140, the second conductive contacts 144, and the plugs 404. The seventh etching process may be a dry etching process, a RIE process, a wet etching process, some other etching process, or a combination of the foregoing. Subsequently, in some embodiments, the sixth masking layer is stripped away.

It will be appreciated that, in some embodiments, rather than performing the seventh etching process, a planarization process (e.g., chemical-mechanical polishing (CMP)) may be performed on the conductive layer, thereby forming the fourth conductive vias 140, the second conductive contacts 144, and the plugs 404. It will further be appreciated that, in some embodiments, the seventh patterned masking layer may be formed before the conductive layer is deposited. In such embodiments, after the conductive layer is deposited, a planarization process (e.g., (CMP)) may be performed on the conductive layer, thereby forming the fourth conductive vias 140, the second conductive contacts 144, and the plugs 404.

It will further be appreciated that, in some embodiments, the fourth conductive vias 140, the second conductive contacts 144, and/or the plugs 404 may be formed by different deposition/etching/planarizing process(es). For example, in some embodiments, the plugs 404 comprise a different material than the fourth conductive vias 140 and the second conductive contacts 144. In such embodiments, the plugs 404 may be formed before (or after) the fourth conductive vias 140 and the second conductive contacts 144 are formed. In further such embodiments, a process for forming the plugs 404 may comprise depositing or growing a plug material layer (not shown) over the third dielectric layer 138, over the second conductive lines 123, in the via openings 142, in the second plurality of openings 1602, and at least partially in the vent holes 402.

Thereafter, an eighth patterned masking layer (not shown) (e.g., positive/negative photoresist, hardmask, etc.) is formed over the plug material layer. An eighth etching process is then performed to remove unmasked portions of the plug material layer, thereby forming the plugs 404. The plug material layer may be, for example, a metal (e.g., Al, Cu, AlCu, Ti, Ag, Au, or the like), a metal nitride (e.g., TiN), an oxide (e.g., $SiO_2$), a nitride (e.g., SiN), an oxy-nitride (e.g., $SiO_XN_Y$), a semiconductor material (e.g., amorphous silicon, Ge, etc.), some other suitable material for covering and sealing the vent holes 402, or a combination of the foregoing. The plug material layer may be deposited or grown by, for example, CVD, PVD, ALD, epitaxy, electroless plating, electrochemical plating, some other deposition process, or a combination of the foregoing. The eighth etching process may be a dry etching process, a RIE process, a wet etching process, some other etching process, or a combination of the foregoing. Subsequently, in some embodiments, the eighth patterned masking layer is stripped away.

Figure 19:
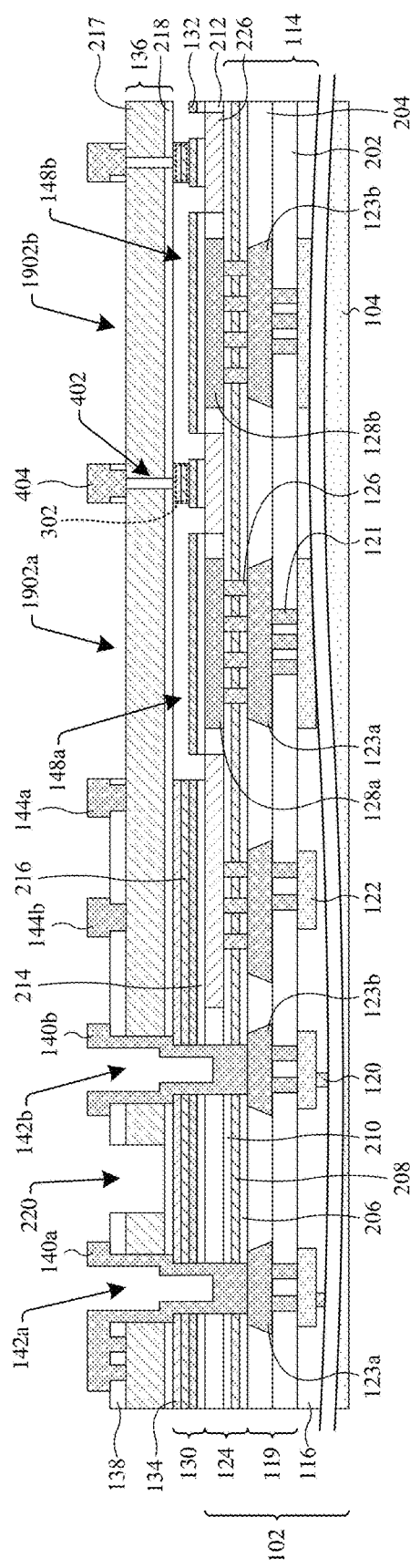

As shown in FIG. 19, a third plurality of openings 1902 are formed over the MEMS substrate 136. The third plurality of openings 1902 are formed directly over the cavities 148, respectively. For example, a third opening 1902a of the third plurality of openings 1902 is formed directly over the first cavity 148a, and a fourth opening 1902b of the third plurality of openings 1902 is formed directly over the second cavity 148b. In some embodiments, the plugs 404 (and/or the second conductive contacts 144) separate the third plurality of openings 1902 from one another.

In some embodiments, a process for forming the third plurality of openings 1902 comprises forming a ninth patterned masking layer (not shown) (e.g., positive/negative photoresist, hardmask, etc.) over the third dielectric layer 138, the fourth conductive vias 140, the second conductive contacts 144, and the plugs 404. Thereafter, a ninth etching process is performed to remove unmasked portions of the third dielectric layer 138, thereby forming the third plurality of openings 1902. The ninth etching process may be a dry etching process, a RIE process, a wet etching process, some other etching process, or a combination of the foregoing. Subsequently, the ninth patterned masking layer may be stripped away.

Also shown in FIG. 19, an isolation trench 220 is formed laterally between the fifth conductive via 140a and the sixth conductive via 140b. The isolation trench 220 is formed extending vertically through the third dielectric layer 138 and into the MEMS substrate 136. In some embodiments, a process for forming the isolation trench 220 comprises forming a tenth patterned masking layer (not shown) (e.g., positive/negative photoresist, hardmask, etc.) over the third dielectric layer 138, the fourth conductive vias 140, the second conductive contacts 144, the plugs 404, and in the third plurality of openings 1902. Thereafter, a tenth etching process is performed to remove unmasked portions of the third dielectric layer 138 and unmasked portions of the MEMS substrate 136, thereby forming the isolation trench 220. Subsequently, the tenth patterned masking layer may be stripped away. In some embodiments, the tenth etching process removes unmasked portions of the first MEMS structure 217 and stops at unmasked portions of the second MEMS structure 218. The tenth etching process may be a dry etching process, a RIE process, a wet etching process, some other etching process, or a combination of the foregoing. It will be appreciated that, in some embodiments, the isolation trench 220 may be at least partially formed by the ninth etching process.

Figure 20:
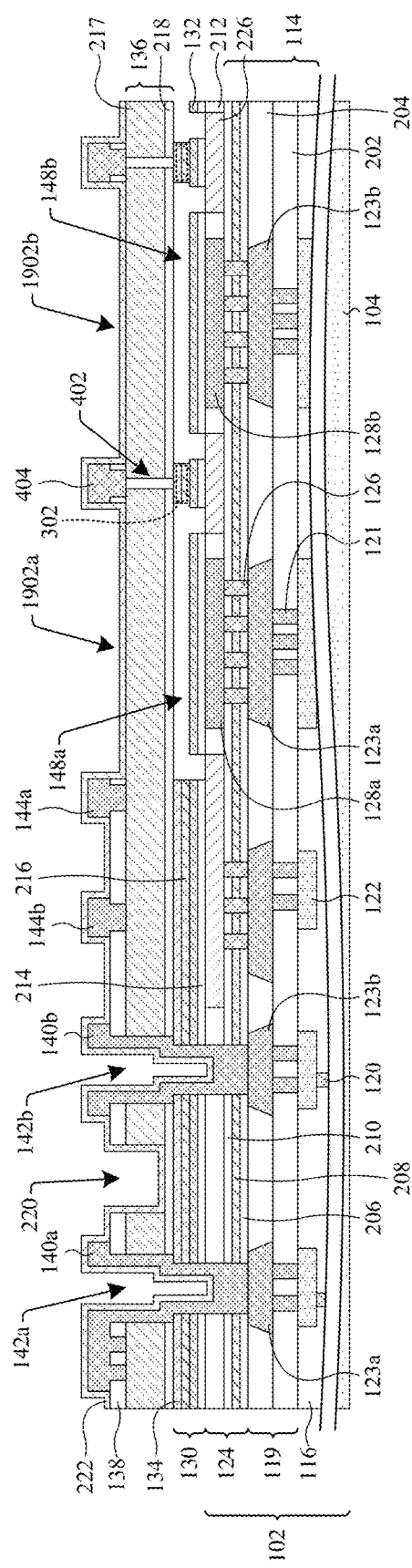

As shown in FIG. 20, a first passivation layer 222 is formed over the third dielectric layer 138, the fourth conductive vias 140, the second conductive contacts 144, the plugs 404, the first MEMS structure 217, and the second MEMS structure 218. In some embodiments, the first passivation layer 222 is formed lining the fourth conductive vias 140, the second conductive contacts 144, the plugs 404, the isolation trench 220, and the third plurality of openings 1902. In further embodiments, a process for forming the first passivation layer 222 comprises depositing the first passivation layer 222 over the third dielectric layer 138, the fourth conductive vias 140, the second conductive contacts 144, the plugs 404, and the MEMS substrate 136. The first passivation layer 222 may be deposited by, for example, CVD, PVD, ALD, some other deposition process, or a combination of the foregoing. In some embodiments, the first passivation layer 222 may be deposited as a conformal layer.

Figure 21:
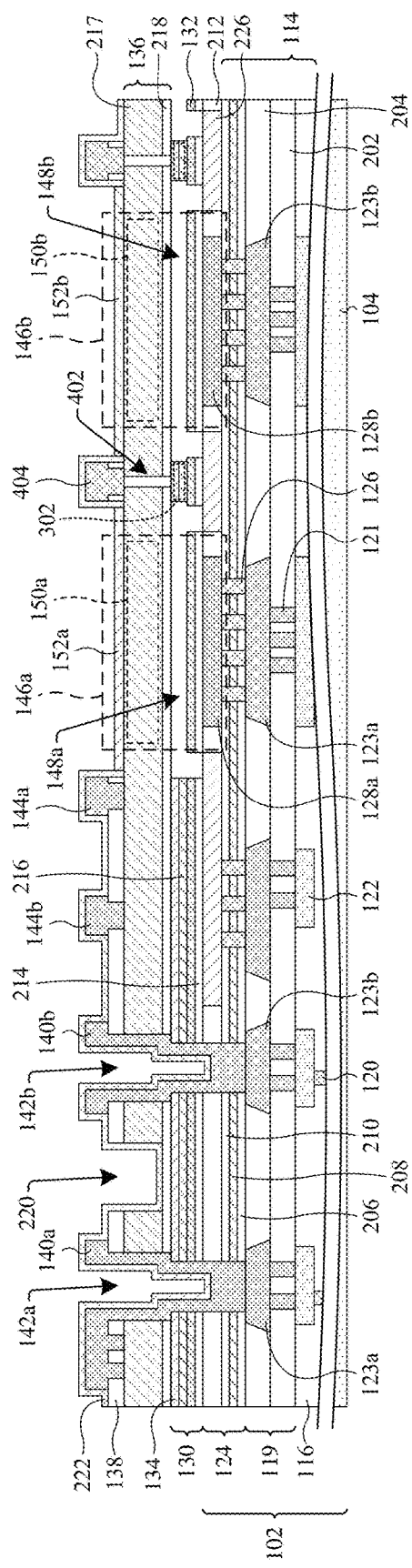

As shown in FIG. 21, functional structures 152 are formed over the MEMS substrate 136. The functional structures 152 are formed in the third plurality of openings 1902 (see, e.g., FIG. 20), respectively. For example, a first functional structure 152a of the functional structures 152 is formed in the third opening 1902a (see, e.g., FIG. 20), and a second functional structure 152b of the functional structures 152 is formed in the fourth opening 1902b (see, e.g., FIG. 20). In some embodiments, the functional structures 152 are formed on the first MEMS structure 217. In further embodiments, the functional structures 152 are formed with bottommost surfaces that are substantially co-planar.

In some embodiments, a process for forming the functional structures 152 comprises forming an eleventh patterned masking layer (not shown) (e.g., positive/negative photoresist, hardmask, etc.) over the first passivation layer 222. Thereafter, an eleventh etching process is performed to remove unmasked portions of the first passivation layer 222. The unmasked portions of the first passivation layer 222 that are removed by the eleventh etching process are disposed in the third plurality of openings 1902 (see, e.g., FIG. 20). The eleventh etching process may be a dry etching process, a RIE process, a wet etching process, some other etching process, or a combination of the foregoing. In some embodiments, removing the unmasked portions of the first passivation layer 222 exposes portions of the MEMS substrate 136. Subsequently, the eleventh patterned masking layer may be stripped away.

A first functional material layer (not shown) is then deposited over the first passivation layer 222 and over the MEMS substrate 136. The first functional material layer may be or comprise, for example, a piezoelectric material (e.g., molybdenum (Mo), lead zirconate titanate (PZT), aluminum nitride (AlN), zinc oxide (ZnO), etc), a biosensitive material (e.g., a bio-recognition component disposed on (or part of) a metal (e.g., Au, Ag, platinum (Pt), etc.)), an IR sensitive material (e.g., vanadium oxide (VOx), mercury cadmium telluride (HgCdTe), silicon (Si), cadmium zinc telluride (CdZnTe), etc.), a polymer (e.g., polyimide, SU-8, negative/positive photoresist, etc.), or the like. The first functional material layer may be deposited by, for example, CVD, PVD, ALD, electroless plating, electrochemical plating, some other deposition process, or a combination of the foregoing.

Thereafter, a twelfth patterned masking layer (not shown) (e.g., positive/negative photoresist, hardmask, etc.) is formed over the first functional material layer. A twelfth etching process is then performed to remove unmasked portions of the first functional material layer, thereby forming the first functional structure 152a. The first functional structure 152a is a portion of the first functional material layer not removed by the twelfth etching process. The twelfth etching process may be a dry etching process, a RIE process, a wet etching process, some other etching process, or a combination of the foregoing. Subsequently, the twelfth patterned masking layer may be stripped away.

In some embodiments, the first functional material layer may be formed as a conformal layer. In further embodiments, the first functional material layer may be formed having a thickness between about 0.0005 um and about 50 um. More specifically, if the first functional material layer is a polymer, the first functional material layer may be formed having a thickness between about 0.0005 um and about 10 um; if the first functional material layer is an IR sensitive material, the first functional material layer may be formed having a thickness between about 0.1 um and about 0.2 um; and if the first functional material layer is a piezoelectric material, the first functional material layer may be formed having a thickness between about 0.05 um and about 50 um.

After the first functional structure 152a is formed, a second functional material layer (not shown) is deposited over the first passivation layer 222, over the MEMS substrate 136, and over the first functional structure 152a. The second functional material layer may be or comprise, for example, a piezoelectric material (e.g., molybdenum (Mo), lead zirconate titanate (PZT), aluminum nitride (AlN), zinc oxide (ZnO), etc), a biosensitive material (e.g., a bio-recognition component disposed on (or part of) a metal (e.g., Au, Ag, platinum (Pt), etc.)), an IR sensitive material (e.g., vanadium oxide (VOx), mercury cadmium telluride (HgCdTe), silicon (Si), cadmium zinc telluride (CdZnTe), etc.), a polymer (e.g., polyimide, SU-8, negative/positive photoresist, etc.), or the like. The second functional material layer may be deposited by, for example, CVD, PVD, ALD, electroless plating, electrochemical plating, some other deposition process, or a combination of the foregoing. In some embodiments, the second functional material layer is a different material than the first functional material layer.

Thereafter, a thirteenth patterned masking layer (not shown) (e.g., positive/negative photoresist, hardmask, etc.) is formed over the second functional material layer. A thirteenth etching process is then performed to remove unmasked portions of the second functional material layer, thereby forming the second functional structure 152b. The second functional structure 152b is a portion of the second functional material layer not removed by the thirteenth etching process. The thirteenth etching process may be a dry etching process, a RIE process, a wet etching process, some other etching process, or a combination of the foregoing. Subsequently, the thirteenth patterned masking layer may be stripped away.

In some embodiments, the second functional material layer may be formed as a conformal layer. In further embodiments, the second functional material layer may be formed having a thickness between about 0.0005 um and about 50 um. More specifically, if the second functional material layer is a polymer, the second functional material layer may be formed having a thickness between about 0.0005 um and about 10 um; if the second functional material layer is an IR sensitive material, the second functional material layer may be formed having a thickness between about 0.1 um and about 0.2 um; and if the second functional material layer is a piezoelectric material, the second functional material layer may be formed having a thickness between about 0.05 um and about 50 um. It will be appreciated that, in some embodiments, the second functional structure 152b may be formed before the first functional structure 152a.

In some embodiments, after the functional structures 152 are formed, formation of a plurality of MEMS devices 146 is complete. The MEMS devices 146 comprise the cavities 148, movable membranes 150, and the functional structures 152, respectively. For example, a first MEMS device 146a of the MEMS devices 146 comprises the first cavity 148a, a first movable membrane 150a of the movable membranes 150, and the first functional structure 152a, and a second MEMS device 146b of the MEMS devices 146 comprises the second cavity 148b, a second movable membrane 150b of the movable membranes 150, and the second functional structure 152b.

The first MEMS device 146a and the second MEMS device 146b are different types of MEMS devices. For example, in some embodiments, the second functional material layer is a different material than the first functional material layer. Thus, the first MEMS device 146a and the second MEMS device 146b are formed with different configurations due a difference in the chemical compositions of the first functional structure 152a and the second functional structure 152b. Accordingly, the first MEMS device 146a and the second MEMS device 146b may be different types of MEMS devices (e.g., IR detection sensor and a PMUT). Because the first MEMS device 146a and the second MEMS device 146b are different types of MEMS devices, manufacturing costs may be reduced, packaging sizes may be reduced, power consumption may be reduced, etc. It will be appreciated that differences in configurations between different types of MEMS devices is not limited to a difference in the chemical compositions of the functional structure, rather other types of differences may exist between the different types of MEMS devices, such as differences in doping concentrations of the movable membrane, the presence versus absence of the functional structure, etc.

Figure 22:
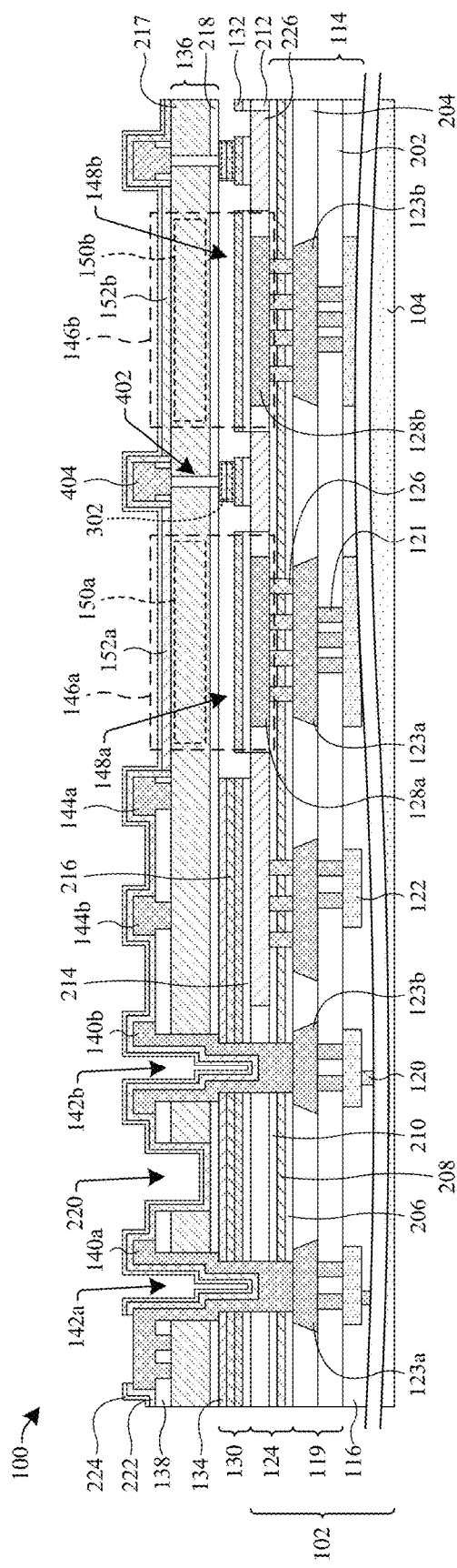

As shown in FIG. 22, a second passivation layer 224 is formed over the first passivation layer 222 and the functional structures 152. In some embodiments, a process for forming the second passivation layer 224 comprises depositing the second passivation layer 224 over the first passivation layer 222 and the functional structures 152. The second passivation layer 224 may be deposited by, for example, CVD, PVD, ALD, some other deposition process, or a combination of the foregoing. In some embodiments, the second passivation layer 224 may be formed as a conformal layer. In further embodiments, the second passivation layer 224 may be formed with a thickness between about 0.05 um and about 2 um.

Also shown in FIG. 22, in some embodiments, a portion of the first passivation layer 222 disposed over the fifth conductive via 140a and a portion of the second passivation layer 224 disposed over the fifth conductive via 140a may be removed. In some embodiments, a process for removing the portion of the first passivation layer 222 and the portion of the second passivation layer 224 that are disposed over the fifth conductive via 140a comprises forming a fourteenth patterned masking layer over the second passivation layer 224.

Thereafter, a fourteenth etching process is performed to remove an unmasked portion of the second passivation layer 224 and an unmasked portion of the first passivation layer 222, thereby removing the portion of the first passivation layer 222 and the portion of the second passivation layer 224 that are disposed over the fifth conductive via 140a. The fourteenth etching process may be a dry etching process, a RIE process, a wet etching process, some other etching process, or a combination of the foregoing. Subsequently, the fourteenth patterned masking layer may be stripped away. In some embodiments, after the second passivation layer 224 is formed, formation of the semiconductor device 100 is complete.

Figure 23:
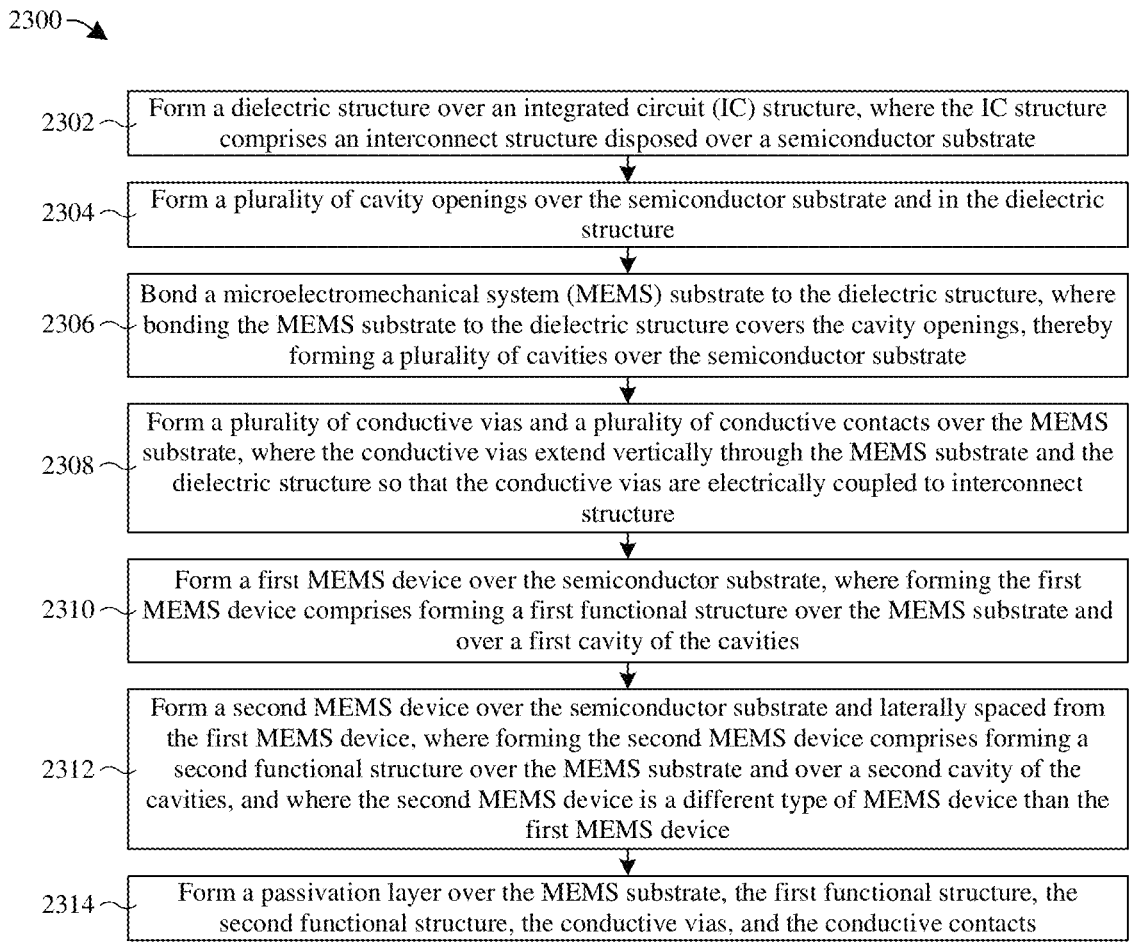
FIG. 23 illustrates a flowchart of some embodiments of a method for forming a semiconductor device comprising different types of microelectromechanical system (MEMS) devices.

FIG. 23 illustrates a flowchart of some embodiments of a method for forming a semiconductor device comprising different types of microelectromechanical system (MEMS) devices. While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2302, a dielectric structure is formed over an integrated circuit (IC) structure, where the IC structure comprises an interconnect structure disposed over a semiconductor substrate. FIG. 11 illustrates a cross-sectional view of some embodiments corresponding to act 2302.

At act 2304, a plurality of cavity openings are formed over the semiconductor substrate and in the dielectric structure. FIGS. 12-13 illustrate a series of cross-sectional views of some embodiments corresponding to act 2304.

At act 2306, a microelectromechanical system (MEMS) substrate is bonded to the dielectric structure, where bonding the MEMS substrate to the dielectric structure covers the cavity openings, thereby forming a plurality of cavities over the semiconductor substrate. FIGS. 14-15 illustrate a series of cross-sectional views of some embodiments corresponding to act 2306.

At act 2308, a plurality of conductive vias and a plurality of conductive contacts are formed over the MEMS substrate, where the conductive vias extend vertically through the MEMS substrate and the dielectric structure so that the conductive vias are electrically coupled to interconnect structure. FIGS. 16-18 illustrate a series of cross-sectional views of some embodiments corresponding to act 2308.

At act 2310, a first MEMS device is formed over the semiconductor substrate, where forming the first MEMS device comprises forming a first functional structure over the MEMS substrate and over a first cavity of the cavities. FIGS. 19-21 illustrate a series of cross-sectional views of some embodiments corresponding to act 2310.

At act 2312, a second MEMS device is formed over the semiconductor substrate and laterally spaced from the first MEMS device, where forming the second MEMS device comprises forming a second functional structure over the MEMS substrate and over a second cavity of the cavities, and where the second MEMS device is a different type of MEMS device than the first MEMS device. FIGS. 19-21 illustrate a series of cross-sectional views of some embodiments corresponding to act 2312.

At act 2314, a passivation layer is formed over the MEMS substrate, the first functional structure, the second functional structure, the conductive vias, and the conductive contacts. FIG. 22 illustrates a cross-sectional view of some embodiments corresponding to act 2314.

In some embodiments, the present application provides a semiconductor device. The semiconductor device comprises an interconnect structure disposed over a semiconductor substrate. A first dielectric structure is disposed over the interconnect structure. A first cavity is disposed in the first dielectric structure. A second cavity is disposed in the first dielectric structure and laterally spaced from the first cavity. A microelectromechanical (MEMS) substrate is disposed over the first dielectric structure, where the MEMS substrate comprises a first movable membrane overlying the first cavity and a second movable membrane overlying the second cavity. A first functional structure overlies the first movable membrane and the first cavity, where the first functional structure comprises a first material having a first chemical composition. A second functional structure overlies the second movable membrane and the second cavity, where the second functional structure is laterally spaced from the first functional structure, and where the second functional structure comprises a second material having a second chemical composition different than the first chemical composition.

In some embodiments, the present application provides a semiconductor device. The semiconductor device comprises an interconnect structure disposed over a semiconductor substrate. A dielectric structure is disposed over the interconnect structure. A first cavity is disposed in the dielectric structure. A second cavity is disposed in the dielectric structure and laterally spaced from the first cavity. A microelectromechanical (MEMS) substrate is disposed over the dielectric structure, where the MEMS substrate comprises a first movable membrane overlying the first cavity and a second movable membrane overlying the second cavity. A sensing structure overlies the first movable membrane and the first cavity, where a physical property of the sensing structure changes in response to an external stimulus. A passivation layer is disposed over the MEMS substrate, where the sensing structure vertical separates a first bottom surface of the passivation layer from an upper surface of the first movable membrane, and where a second bottom surface of the passivation layer overlies the second movable membrane and is disposed vertically between the first bottom surface and the upper surface of the first movable membrane.

In some embodiments, the present application provides a method for forming a semiconductor device. The method comprises receiving an integrated circuit (IC) structure, where the IC structure comprises an interconnect structure disposed over a semiconductor substrate of the IC structure. A dielectric structure is formed over the interconnect structure. A first opening is formed in the dielectric structure. A second opening is formed in the dielectric structure and laterally spaced from the first opening. A microelectromechanical (MEMS) substrate is bonded to the dielectric structure, where bonding the MEMS substrate to the dielectric structure covers the first opening and the second opening, thereby forming a first cavity and a second cavity, respectively. A first functional structure is formed over the MEMS substrate and overlying the first cavity. A second functional structure is formed over the MEMS substrate and overlying the second cavity, wherein the second functional structure has a different chemical composition than the first functional structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an interconnect structure disposed over a semiconductor substrate;
   a first dielectric structure disposed over the interconnect structure;
   a first cavity disposed in the first dielectric structure;
   a second cavity disposed in the first dielectric structure and laterally spaced from the first cavity;
   a microelectromechanical system (MEMS) substrate disposed over the first dielectric structure, wherein the MEMS substrate comprises a first movable membrane overlying the first cavity and a second movable membrane overlying the second cavity;
   a first functional layer overlying and contacting the first movable membrane, wherein the first functional layer comprises a first material having a first chemical composition, wherein the first material is different from a material of the first movable membrane; and
   a second functional layer overlying the second movable membrane and the second cavity, wherein the second functional layer is laterally spaced from the first functional layer, and wherein the second functional layer comprises a second material having a second chemical composition different than the first chemical composition.

2. The semiconductor device of claim 1, wherein:
   the first functional layer is configured to deflect the first movable membrane in response to a first stimulus; and
   the second functional layer is configured to deflect the second movable membrane in response to a second stimulus different than the first stimulus.

3. The semiconductor device of claim 2, wherein:
the first functional layer deflects the first movable membrane a first distance in response to the first stimulus; and
the second functional layer either does not deflect the second movable membrane in response to the first stimulus or deflects the second movable membrane a second distance less than the first distance in response to the first stimulus.

4. The semiconductor device of claim 1, wherein:
a bottommost surface of the first functional layer is substantially co-planar with a bottommost surface of the second functional layer.

5. The semiconductor device of claim 4, wherein:
the first functional layer has a first thickness; and
the second functional layer has a second thickness different than the first thickness.

6. The semiconductor device of claim 4, wherein:
the first functional layer has a first thickness; and
the second functional layer has a second thickness that is substantially the same as the first thickness.

7. The semiconductor device of claim 1, further comprising:
a second dielectric structure disposed between the first dielectric structure and the semiconductor substrate;
a first electrode disposed in the second dielectric structure and electrically coupled to the interconnect structure, wherein the first cavity overlies the first electrode, and wherein the first electrode outputs a first electrical signal that corresponds to a first distance in which the first movable membrane is spaced from the first electrode; and
a second electrode disposed in the second dielectric structure and electrically coupled to the interconnect structure, wherein the second cavity overlies the second electrode, and wherein the second electrode outputs a second electrical signal that corresponds to a second distance in which the second movable membrane is spaced from the second electrode.

8. The semiconductor device of claim 1, further comprising:
a fluid communication channel disposed in the first dielectric structure, wherein the fluid communication channel extends laterally between the first cavity and the second cavity, such that the first cavity and the second cavity are in fluid communication.

9. The semiconductor device of claim 1, wherein:
the first material is an infrared radiation (IR) sensitive material; and
the second material is not an IR sensitive material.

10. The semiconductor device of claim 1, wherein:
the first material is a piezoelectric material; and
the second material is not a piezoelectric material.

11. The semiconductor device of claim 1, wherein:
the first material is a biosensitive material; and
the second material is not a biosensitive material.

12. The semiconductor device of claim 1, wherein:
the first material is a polymer; and
the second material is not a polymer.

13. A semiconductor device, comprising:
an interconnect structure disposed over a semiconductor substrate;
a dielectric structure disposed over the interconnect structure;
a first cavity disposed in the dielectric structure;
a second cavity disposed in the dielectric structure and laterally spaced from the first cavity;
a microelectromechanical system (MEMS) substrate disposed over the dielectric structure, wherein the MEMS substrate comprises a first movable membrane overlying the first cavity and a second movable membrane overlying the second cavity;
a sensing structure overlying the first movable membrane and the first cavity, wherein a physical property of the sensing structure changes in response to an external stimulus; and
a passivation layer disposed over the MEMS substrate, wherein the sensing structure vertically separates a first bottom surface of the passivation layer from an upper surface of the first movable membrane, wherein a second bottom surface of the passivation layer overlies the second movable membrane and is disposed vertically between the first bottom surface and the upper surface of the first movable membrane, wherein the passivation layer directly contacts an upper surface of the sensing structure and an upper surface of the second movable membrane.

14. The semiconductor device of claim 13, wherein:
the sensing structure has a first chemical composition; and
the passivation layer has a second chemical composition that is different than the sensing structure.

15. The semiconductor device of claim 13, further comprising:
a fluid communication channel disposed in the dielectric structure, wherein the fluid communication channel extends laterally between the first cavity and the second cavity, such that the first cavity and the second cavity are in fluid communication.

16. The semiconductor device of claim 15, further comprising:
a vent hole disposed in the MEMS substrate, wherein the vent hole extends vertically from the fluid communication channel through an uppermost surface of the MEMS substrate; and
a plug disposed over the MEMS substrate and covering the vent hole, wherein the passivation layer is a continuous layer that covers both the sensing structure and the plug.

17. A semiconductor device, comprising:
a first microelectromechanical system (MEMS) device over a semiconductor substrate, wherein the first MEMS device comprises a first movable membrane overlying a first cavity and a first sensing layer overlying and directly contacting the first movable membrane, wherein the first movable membrane is part of a MEMS substrate, wherein the first sensing layer is discrete from the MEMS substrate; and
a second MEMS device over the semiconductor substrate and laterally adjacent to the first MEMS device, wherein the second MEMS device comprises a second movable membrane overlying a second cavity and a second sensing layer overlying and directly contacting the second movable membrane, wherein the first sensing layer is different from the second sensing layer.

18. The semiconductor device of claim 17, wherein the first sensing layer comprises a first material and the second sensing layer comprises a second material different from the first material.

19. The semiconductor device of claim 17,
wherein the second movable membrane is part of the MEMS substrate, wherein a top surface of the MEMS substrate is aligned with a horizontal line, wherein a bottom surface of the first sensing layer and a bottom surface of the second sensing layer are aligned with the horizontal line.

20. The semiconductor device of claim 17, wherein the second sensing layer is discrete from the MEMS substrate.

* * * * *